(12) United States Patent
Gans

(10) Patent No.: US 11,955,977 B2
(45) Date of Patent: Apr. 9, 2024

(54) APPARATUSES AND METHODS FOR DUTY CYCLE ADJUSTMENT OF A SEMICONDUCTOR DEVICE

(71) Applicant: MICRON TECHNOLOGY, INC., Boise, ID (US)

(72) Inventor: Dean D. Gans, Nampa, ID (US)

(*) Notice: Subject to any disclaimer, the term of this patent is extended or adjusted under 35 U.S.C. 154(b) by 0 days.

(21) Appl. No.: 17/501,858

(22) Filed: Oct. 14, 2021

(65) Prior Publication Data

US 2022/0149828 A1 May 12, 2022

Related U.S. Application Data

(63) Continuation of application No. 16/917,428, filed on Jun. 30, 2020, now Pat. No. 11,152,929, which is a
(Continued)

(51) Int. Cl.
*G11C 7/22* (2006.01)
*G11C 7/00* (2006.01)
*G11C 8/18* (2006.01)
*G11C 11/4076* (2006.01)
*G11C 29/00* (2006.01)
(Continued)

(52) U.S. Cl.
CPC .............. *H03K 5/1565* (2013.01); *G11C 7/00* (2013.01); *G11C 7/22* (2013.01); *G11C 7/222* (2013.01); *G11C 8/18* (2013.01); *G11C 11/4076* (2013.01); *G11C 29/00* (2013.01); *G11C 29/023* (2013.01); *G11C 29/028* (2013.01);
(Continued)

(58) Field of Classification Search
CPC ...................... G11C 11/4076; G11C 29/50012
See application file for complete search history.

(56) References Cited

U.S. PATENT DOCUMENTS 5,689,460 A 11/1997 Ooishi
5,847,589 A 12/1998 Arai et al.
(Continued)

FOREIGN PATENT DOCUMENTS

CN 101647004 A 2/2010
CN 101789773 A 7/2010
(Continued)

OTHER PUBLICATIONS

Continuation U.S. Appl. No. 17/668,592 titled "Apparatuses and Methods for Setting a Duty Cycle Adjuster for Improving Clock Duty Cycle" filed Feb. 10, 2022, pp. all pages of application as filed.
(Continued)

*Primary Examiner* — Mushfique Siddique

(57) ABSTRACT

Embodiments of the disclosure are drawn to apparatuses and methods for lookahead duty cycle adjustment of a clock signal. Clock signals may be provided to a semiconductor device, such as a memory device, to synchronize one or more operations. A duty cycle adjuster (DCA) of the device may adjust the clock signal(s) based on a duty code determined during an initialization of the device. While the device is in operation, a lookahead DCA (LA DCA) may test a number of different adjustments to the clock signal(s), the results of which may be determined by a duty cycle monitor (DCM). The results of the DCM may be used to select one of the tested adjustments, which may be used to update the duty code.

16 Claims, 10 Drawing Sheets

Related U.S. Application Data continuation of application No. 16/198,493, filed on Nov. 21, 2018, now Pat. No. 10,715,127.

(51) Int. Cl.
    *G11C 29/02*              (2006.01)
    *G11C 29/50*              (2006.01)
    *H03K 5/156*             (2006.01)
    *G11C 7/10*               (2006.01)

(52) U.S. Cl.
    CPC ...... *G11C 29/50012* (2013.01); *G11C 7/1045* (2013.01); *G11C 2207/2254* (2013.01)

(56) References Cited

U.S. PATENT DOCUMENTS

| | | | |
|---|---|---|---|
| 6,396,329 B1 | 5/2002 | Zerbe | |
| 6,700,814 B1 | 3/2004 | Nahas et al. | |
| 6,870,419 B1 | 3/2005 | Garrett, Jr. et al. | |
| 7,414,445 B2 | 8/2008 | Heyne | |
| 7,609,583 B2 | 10/2009 | Booth et al. | |
| 7,990,802 B2 | 8/2011 | Booth et al. | |
| 8,189,403 B2 | 5/2012 | Sohn et al. | |
| 8,289,807 B2 | 10/2012 | Booth et al. | |
| 9,202,561 B1 | 12/2015 | Park et al. | |
| 9,263,107 B1 | 2/2016 | Wayland et al. | |
| 9,448,580 B2 | 9/2016 | Kim et al. | |
| 9,449,687 B1 | 9/2016 | Piccardi et al. | |
| 9,805,773 B1 | 10/2017 | Shi et al. | |
| 9,818,462 B1 | 11/2017 | Polney | |
| 9,859,932 B2 | 1/2018 | Hwang | |
| 10,249,354 B1 | 4/2019 | Lee et al. | |
| 10,367,493 B1 | 7/2019 | Addepalli et al. | |
| 10,529,398 B1 | 1/2020 | Lee et al. | |
| 10,600,459 B2 | 3/2020 | Kim | |
| 10,715,127 B2 | 7/2020 | Gans | |
| 10,783,940 B2 | 9/2020 | Kim | |
| 10,902,897 B2 | 1/2021 | Kim | |
| 11,003,370 B2 | 5/2021 | Kim et al. | |
| 11,100,967 B2 | 8/2021 | Kim | |
| 11,145,341 B2 | 10/2021 | Kim | |
| 11,152,929 B2 | 10/2021 | Gans | |
| 11,189,334 B2 | 11/2021 | Gans | |
| 11,200,931 B2 | 12/2021 | Kim | |
| 11,309,001 B2 | 4/2022 | Kim | |
| 11,694,734 B2 | 7/2023 | Kim | |
| 11,694,736 B2 | 7/2023 | Kim | |
| 2003/0221044 A1 | 11/2003 | Nishio et al. | |
| 2004/0075462 A1 | 4/2004 | Kizer et al. | |
| 2004/0135608 A1 | 7/2004 | Pillay et al. | |
| 2004/0218425 A1 | 11/2004 | Fukushima | |
| 2004/0243753 A1 | 12/2004 | Horowitz et al. | |
| 2005/0002293 A1 | 1/2005 | Hsu et al. | |
| 2006/0170453 A1 | 8/2006 | Zerbe et al. | |
| 2007/0075753 A1 | 4/2007 | Parker et al. | |
| 2007/0079197 A1 | 4/2007 | Boerstler et al. | |
| 2007/0086267 A1 | 4/2007 | Kwak | |
| 2007/0271052 A1 | 11/2007 | Abel et al. | |
| 2008/0036509 A1 | 2/2008 | Jang | |
| 2008/0159017 A1 | 7/2008 | Kim et al. | |
| 2009/0125857 A1 | 5/2009 | Boerstler et al. | |
| 2009/0140785 A1 | 6/2009 | Choi | |
| 2010/0060334 A1* | 3/2010 | Abe ................. H03L 7/087 | |
| | | | 327/158 |
| 2010/0105448 A1 | 4/2010 | Andrys et al. | |
| 2010/0109729 A1 | 5/2010 | Shin | |
| 2010/0117702 A1 | 5/2010 | Jang et al. | |
| 2010/0134153 A1 | 6/2010 | Zerbe et al. | |
| 2011/0102039 A1 | 5/2011 | Shin | |
| 2011/0228616 A1 | 9/2011 | Kim et al. | |
| 2011/0291725 A1 | 12/2011 | Shin | |
| 2012/0086489 A1 | 4/2012 | Cherkassky et al. | |
| 2012/0127214 A1 | 5/2012 | Han et al. | |
| 2012/0194244 A1 | 8/2012 | Kim et al. | |
| 2012/0250426 A1 | 10/2012 | Huang | |
| 2012/0280732 A1 | 11/2012 | Roytman et al. | |
| 2013/0051114 A1 | 2/2013 | Kim et al. | |
| 2014/0002156 A1 | 1/2014 | Dwivedi et al. | |
| 2014/0009197 A1* | 1/2014 | Yasuda ................. H03K 3/017 | |
| | | | 327/175 |
| 2014/0253195 A1 | 9/2014 | Chandrasekaran et al. | |
| 2014/0266362 A1 | 9/2014 | Lee et al. | |
| 2014/0333361 A1 | 11/2014 | Chau et al. | |
| 2015/0097603 A1* | 4/2015 | Amirkhany ............ H03K 3/017 | |
| | | | 327/155 |
| 2015/0097605 A1 | 4/2015 | Shin et al. | |
| 2015/0171834 A1 | 6/2015 | Arp et al. | |
| 2015/0222254 A1 | 8/2015 | Walker | |
| 2015/0249454 A1 | 9/2015 | Giaconi et al. | |
| 2015/0295564 A1 | 10/2015 | Jones et al. | |
| 2015/0364176 A1 | 12/2015 | Lee | |
| 2016/0197485 A1 | 7/2016 | Nirantare et al. | |
| 2016/0211774 A1 | 7/2016 | Degner et al. | |
| 2016/0261193 A1 | 9/2016 | Karlsson et al. | |
| 2017/0140726 A1 | 5/2017 | Zhu et al. | |
| 2017/0230018 A1 | 8/2017 | Hwang | |
| 2017/0337952 A1 | 11/2017 | Shi et al. | |
| 2017/0364276 A1 | 12/2017 | Bhuiyan et al. | |
| 2018/0137902 A1 | 5/2018 | Giovannini et al. | |
| 2018/0175834 A1 | 6/2018 | Modi et al. | |
| 2018/0175844 A1 | 6/2018 | Jeong | |
| 2018/0316461 A1 | 11/2018 | Lee et al. | |
| 2018/0350414 A1 | 12/2018 | Park et al. | |
| 2018/0364752 A1 | 12/2018 | Li et al. | |
| 2019/0081619 A1 | 3/2019 | Kim et al. | |
| 2019/0188159 A1 | 6/2019 | Song et al. | |
| 2019/0237127 A1 | 8/2019 | Moon et al. | |
| 2019/0267056 A1 | 8/2019 | Lee et al. | |
| 2019/0272804 A1 | 9/2019 | Amirkhany et al. | |
| 2019/0371376 A1 | 12/2019 | Kim | |
| 2019/0371377 A1 | 12/2019 | Kim | |
| 2019/0371378 A1 | 12/2019 | Kim | |
| 2019/0385654 A1 | 12/2019 | Lee et al. | |
| 2020/0019345 A1 | 1/2020 | Wang et al. | |
| 2020/0133505 A1* | 4/2020 | Kim ................. G11C 29/028 | |
| 2020/0133542 A1 | 4/2020 | Kim et al. | |
| 2020/0160902 A1 | 5/2020 | Gans | |
| 2020/0162066 A1 | 5/2020 | Gans | |
| 2020/0194044 A1 | 6/2020 | Kim | |
| 2020/0336137 A1 | 10/2020 | Gans | |
| 2020/0381029 A1 | 12/2020 | Kim | |
| 2021/0027819 A1 | 1/2021 | Kim | |
| 2021/0151088 A1 | 5/2021 | Kim | |
| 2021/0201971 A1 | 7/2021 | Kim | |
| 2022/0028438 A1 | 1/2022 | Kim | |
| 2022/0148640 A1 | 5/2022 | Gans | |
| 2022/0172756 A1 | 6/2022 | Kim | |
| 2022/0270657 A1 | 8/2022 | Kim | |

FOREIGN PATENT DOCUMENTS

| | | |
|---|---|---|
| CN | 101826860 A | 9/2010 |
| CN | 101903956 A | 12/2010 |
| CN | 102075167 A | 5/2011 |
| CN | 103427825 A | 12/2013 |
| CN | 104428994 A | 3/2015 |
| CN | 104518760 A | 4/2015 |
| CN | 105577142 A | 5/2016 |
| CN | 111066084 A | 4/2020 |
| JP | H04306917 A | 10/1992 |
| JP | H04313887 A | 11/1992 |
| JP | H0554640 A | 3/1993 |
| JP | H09106678 A | 4/1997 |
| JP | 2015162052 A | 9/2015 |
| KR | 20030045771 A | 6/2003 |
| KR | 20110003189 A | 1/2011 |
| KR | 101030275 B1 | 4/2011 |
| KR | 20110097838 A | 8/2011 |
| KR | 2013182659 A | 9/2013 |
| KR | 101331442 B1 | 11/2013 |
| KR | 20140095910 A | 8/2014 |
| KR | 20150041688 A | 4/2015 |
| TW | 408259 B | 10/2000 |
| WO | 0137285 A1 | 5/2001 |

(56) References Cited

FOREIGN PATENT DOCUMENTS

| WO | 2019125948 A1 | 6/2019 |
|----|---------------|--------|
| WO | 2019164663 A1 | 8/2019 |
| WO | 2019231489 A1 | 12/2019 |

OTHER PUBLICATIONS

Extended European Search Report dated Jul. 26, 2022 for EP Application No. 19886988.5; pp. all.
U.S. Appl. No. 17/455,468 titled "Apparatuses and Methods for a Multi-Bit Duty Cycle Monitor" filed Nov. 18, 2021; pp. all pages of application as filed.
U.S. Appl. No. 17/548,163 titled "Apparatuses And Methods For Setting A Duty Cycle Adjuster For Improving Clock Duty Cycle" filed Dec. 10, 2021; pp. all pages of application as filed.
U.S. Appl. No. 16/167,303, titled "Apparatuses and Methods for Setting a Duty Cycle Adjuster for Improving Clock Duty Cycle", filed Oct. 22, 2018, pp. all pages of the application as filed.
U.S. Appl. No. 16/167,326, titled "Apparatuses and Methods for Setting a Duty Cycle Adjuster for Improving Clock Duty Cycle", filed Oct. 22, 2018, pp. all pages of the application as filed.
U.S. Appl. No. 16/167,340, titled "Apparatuses and Methods for Setting a Duty Cycle Adjuster for Improving Clock Duty Cycle" filed Oct. 22, 2018, pp. all pages of the application as filed.
U.S. Appl. No. 16/198,493, titled "Apparatuses and Methods for Duty Cycle Adjustment of a Semiconductor Device", filed Nov. 21, 2018, pp. all pages of the application as filed.
U.S. Appl. No. 16/799,599, titled "Apparatuses and Methods for Setting a Duty Cycle Adjuster for Improving Clock Duty Cycle", dated Feb. 24, 2020, pp. all pages of the application as filed.
U.S. Appl. No. 16/917,428, titled "Apparatuses and Methods for Duty Cycle Adjustment of a Semiconductor Device", dated Jun. 30. 2020, pp. all pages of the application as filed.
U.S. Appl. No. 16/995,568 titled "Apparatuses And Methods For Setting A Duty Cycle Adjuster For Improving Clock Duty Cycle" filed Aug. 20, pp. all pages of the application as filed.
U.S. Appl. No. "Apparatuses and Methods for a Multi-Bit Duty Cycle Monitor", filed Nov. 21, 2018, pp. all pages of the application as filed.
U.S. Appl. No. 17/071,107 titled "Apparatuses and Methods for Setting a Duty Cycle Adjuster for Improving Clock Duty Cycle" filed Oct. 15, 2020, pp. all pages of application as filed.
U.S. Appl. No. 17/155,434 titled "Apparatuses and Methods for Setting a Duty Cycle Adjuster for Improving Clock Duty Cycle" filed Jan. 22, 2021, pp. all pages of the application as filed.
U.S. Appl. No. 17/202,553 titled "Apparatuses and Methods for Setting a Duty Cycle Adjuster for Improving Clock Duty Cycle" filed Mar. 16, 2021, pp. all pages of the application as filed.
International Search Report and Written Opinion for PCT Application No. PCT/US2019/062385, dated Mar. 12. 2020, pp. all.
IPRP dated Jun. 3, 2021 for PCT Application No. PCT/US2019/062385, pp. all.
PCT Application No. PCT/US2018/065738 titled "Apparatuses and Methods for Duty Cycle Error Correction of Clock Signals" filed Dec. 14, 2018, pp. all pages of the application as filed.
PCT Application No. PCT/US2019/016528, titled "Apparatuses and Methods for Duty Cycle Distortion Correction of Clocks", fled Feb. 4, 2019, pp. all pages of the application as filed.
PCT Patent Application PCT/US19/62379 titled "Apparatuses and Methods for a Multi-Bit Duty Cycle Monitor" filed Nov. 20, 2019; pp. all pages of the application as filed.
PCT Patent Application PCT/US19/62385, titled "Apparatuses and Methods for Duty Cycle Adjustment of a Semiconductor Device" filed Nov. 20, 2019. pp. all pages of the application as filed.
U.S. Appl. No. 15/903,934 entitled "Apparatuses and Methods for Duty Cycle Distortion Correction of Clocks" filed Feb. 23, 2018, pp. all pages of the application as filed.
U.S. Appl. No. 17/495,082 titled "Apparatuses and Methods for Setting a Duty Cycle Adjuster for Improving Clock Duty Cycle" filed Oct. 6, 2021, pp. all pages of the application as filed.
U.S. Appl. No. 15/853,514, entitled 'Apparatuses and Methods for Duty Cycle Error Correction of Clock Signals', filed Dec. 22, 2017, pp. all pages of the application as filed.
U.S. Appl. No. 16/274,992, titled "Apparatuses and Methods for Duty Cycle Distortion Correction of Clocks" filed Feb. 13, 2019, pp. all pages of the application as filed.
U.S. Appl. No. 16/551,981 titled "Apparatuses and Methods for Duty Cycle Error Correction of Clock Signals" filed Aug. 27, 2019, pp. all pages of the application as filed.
Raja, Immanuel et al., "A 0.1-2-GHz Quadrature Correction Loop for Digital Multiphase Clock Generation Circuits in 130-nm CMOS", IEEE Transactions on Very Large Scale Integration (VLSI) Systems, vol. 25, Issue 3, Mar. 31, 2017, pp. 1-10.
U.S. Appl. No. 18/310,302 titled, "Apparatuses and Methods for Setting a Duty Cycle Adjuster for Improvingclock Duty Cycle," filed May 1, 2023 ; pp. all pages of application as filed.
U.S. Appl. No. 18/310,738, titled "Apparatuses and Methods for Setting a Duty Cycle Adjuster for Improvingclock Duty Cycle" filed May 2, 2023; pp. all pages of application as filed.
Raja, Immanuel , et al., "A 0.1-2-GHz Quadrature Correction Loop for Digital Multiphase Clock Generation Circuits in 130-nm CMOS", IEEE Transactions on Very Large Scale Integration (VLSI) Systems, vol. 25, No. 3, Mar. 2017, 10 pages.
U.S. Appl. No. 18/397,984, titled "Apparatuses and Methods for a Multi-Bit Duty Cycle Monitor" filed Dec. 27, 2023, pp. all pages of application as filed.

\* cited by examiner

APPARATUSES AND METHODS FOR DUTY CYCLE ADJUSTMENT OF A SEMICONDUCTOR DEVICE

CROSS-REFERENCE TO RELATED APPLICATION(S)

This application is a continuation of U.S. patent application Ser. No. 16/917,428 filed Jun. 30, 2020 and issued as U.S. Pat. No. 11,309,001 on Apr. 19, 2022, which application is a continuation of U.S. patent application Ser. No. 16/198,493, filed Nov. 21, 2018 and issued as U.S. Pat. No. 10,715,127 on Jul. 14, 2020. The aforementioned applications, and issued patents, are incorporated by reference herein, in their entirety, and for any purpose.

BACKGROUND

Semiconductor devices may be used for a variety of applications, such as semiconductor memory devices used to store and retrieve information in computer systems. Clock signals may be provided to the semiconductor device (and/or generated by the semiconductor device) to synchronize the operation of various components to a common timing signal. It may be important to adjust the clock signals in order to achieve reliable operation of the semiconductor device.

The clock signal may have a duty cycle, which is the fraction that a signal is active over one period of a binary periodic signal. For example the clock signal may alternate between a logical high level (e.g., a high voltage level) and a logical low level (e.g., a low voltage level). The semiconductor device may adjust the duty cycle of the clock signal in order to ensure that the clock signal matches a desired duty cycle (e.g., 50%). However, it may be difficult to determine an amount by which to adjust the duty cycle while the semiconductor device is in operation.

DETAILED DESCRIPTION

A semiconductor device, such as a semiconductor memory device, may use clock signals to synchronize the operation of one or more components. Since precise timing of the components may be desired for reliable operation of the memory device, the memory device may monitor and adjust the clock signal in order to ensure that it matches an expected value (or falls within a tolerance of the expected value). When the memory device is initialized (e.g., when the device is powered on), the memory device may determine a duty cycle of the clock signal, and may determine an amount to adjust the duty cycle of the clock signal in order to match a target duty cycle (e.g., 50%). The adjustment may be stored (e.g., in a mode register of the device) as a duty code, which is a value used to correct the duty cycle of the clock signal. However, over time during operation the duty cycle of the clock signal may shift. The process of determining the duty code on initialization may be a lengthy one, and may not be usable while the memory device is in operation (e.g., carrying out access operations, such as read and/or write operations).

The present disclosure is aimed at apparatuses and methods for using 'look-ahead' or 'lookahead' duty cycle correction to determine duty cycle adjustment values while a semiconductor device (e.g., memory device) remains in operation. The lookahead duty cycle correction may use a second duty cycle adjustor (which may be referred to as a lookahead duty cycle adjustor) which is coupled to a second duty code (which may be referred to as a lookahead duty code) that may be used to test out various adjustments to the duty cycle of the clock signal. A sequence of values for a look-ahead code may be generated. The look-ahead code may be potential adjustments to the duty code determined during initialization. The device may test each of the lookahead codes to determine if any of them improve the current operation of the clock signal (e.g., by bringing the duty cycle closer to 50%). The testing may be done along a clock path which does not interfere with the overall operation of the memory device. The duty code may then be updated based on the determined look-ahead code. In this manner, the duty cycle of the clock signal may be monitored, and adjustments to the duty code determined concurrent with access operations (e.g., read and/or write operations) of the memory the memory device.

Although the present disclosure is described with respect to a semiconductor memory device as a specific example, it is to be understood by one of skill in the art that the present disclosure may be used with the clock signals of any semiconductor device.

Figure 1:
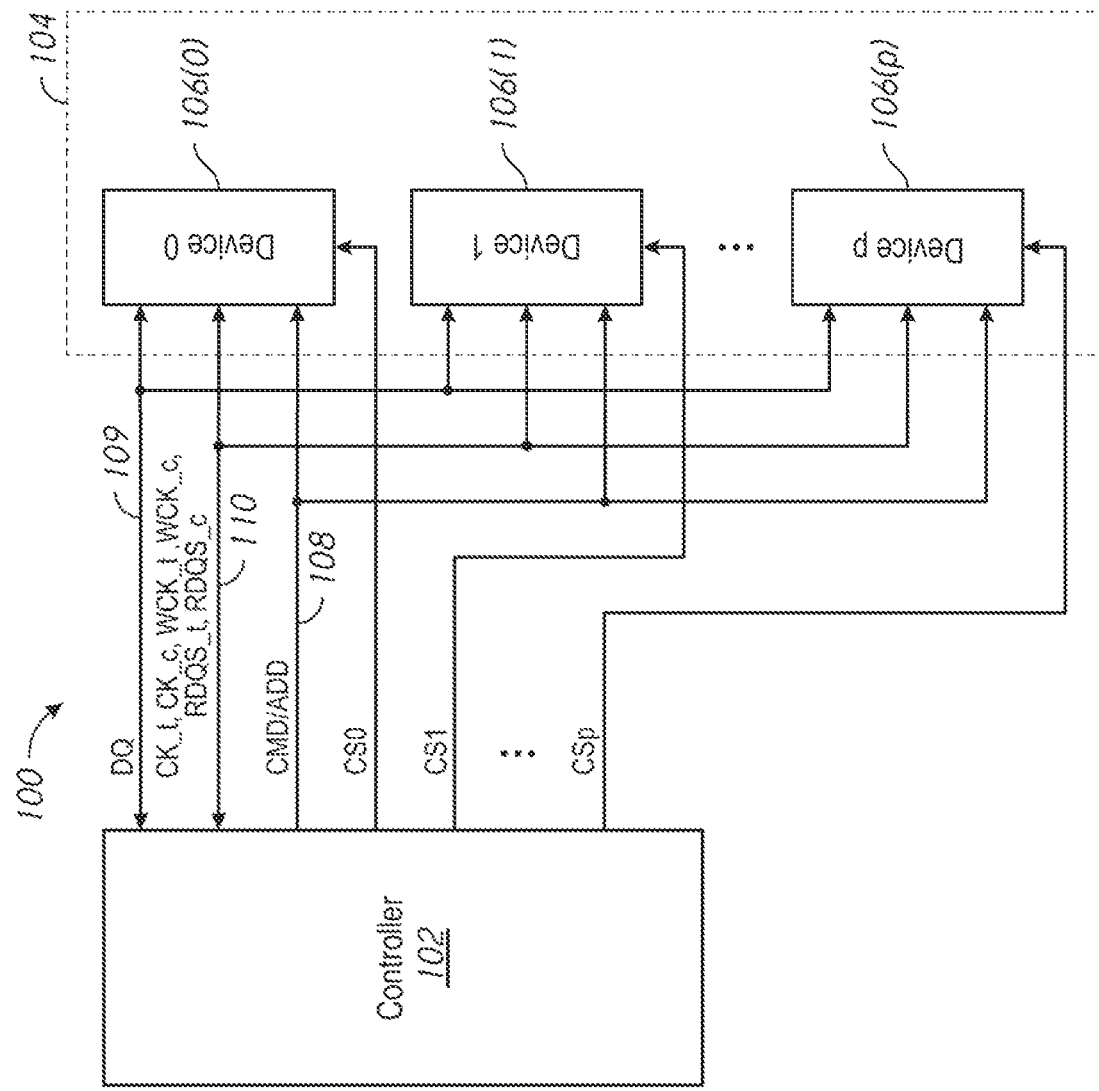
FIG. 1 is a block diagram of a system according to an embodiment of the present disclosure.

FIG. 1 is a block diagram of a system 100 according to an embodiment of the disclosure. The system 100 includes a controller 102 and a memory system 104. The memory system 104 includes memories 106(0)-106(p)(e.g., "Device0" through "Devicep"), where p is a non-zero whole number. The memories 106 may be dynamic random access memory (DRAM), such as low power double data rate (LPDDR) DRAM in some embodiments of the disclosure. The memories 106(0)-106(p) are each coupled to the command/address, data, and clock busses. The controller 102 and the memory system 104 are in communication over several busses. For example, commands and addresses are received by the memory system 104 on a command/address bus 108, and data is provided between the controller 102 and the memory system 104 over a data bus 109. Various clock signals may be provided between the controller and memory system 104 over a clock bus. The clock bus may include signal lines for providing system clock signals CK_t and CK_c received by the memory system 104, data clock WCK_t and WCK_c received by the memory system 104, and access data clock signals RDQS_t and RDQS_c provided by the memory system 104 to the controller 102. Each of the busses may include one or more signal lines on which signals are provided.

The CK_t and CK_c clock signals provided by the controller 102 to the memory system 104 are used for timing the provision and receipt of the commands and addresses. The WCK_t and WCK_c clock signals and the RDQS_t and RDQS_c clock signals are used for timing the provision of data. The CK_t and CK_c clock signals are complementary, the WCK_t and WCK_c clock signals are complementary, and the RDQS_t and RDQS_c clock signals are complementary. Clock signals are complementary when a rising edge of a first clock signal occurs at the same time as a falling edge of a second clock signal, and when a rising edge of the second clock signal occurs at the same time as a falling edge of the first clock signal. The WCK_t and WCK_c clock signals provided by the controller 10 to the memory system 104 may be synchronized to the CK_t and CK_c clock signals also provided by the controller 102 to the memory system 104. Additionally, the WCK_t and WCK_c clock signals may have a higher clock frequency than the CK_t and CK_c clock signals. For example, in some embodiments of the disclosure, the WCK_t and WCK_c clock signals have a clock frequency that is four times the clock frequency of the CK_t and CK_c clock signals.

The controller 102 provides commands to the memory system 104 to perform memory operations. Non-limiting examples of memory commands include timing commands for controlling the timing of various operations, access commands for accessing the memory, such as read commands for performing read operations and write commands for performing write operations, mode register write and read commands for performing mode register write and read operations, as well as other commands and operations. The command signals provided by the controller 10 to the memory system 104 further include select signals (e.g., chip select CS signals CS0, CS1, CSp). While all of the memories 106 are provided the commands, addresses, data, and clock signals, the select signals provided on respective select signal lines are used to select which of the memories 106 will respond to the command and perform the corresponding operation. In some embodiments of the disclosure, a respective select signal is provided to each memory 106 of the memory system 104. The controller 102 provides an active select signal to select the corresponding memory 106. While the respective select signal is active, the corresponding memory 106 is selected to receive the commands and addresses provided on the command/address bus 108.

In operation, when a read command and associated address are provided by the controller 102 to the memory system 104, the memory 106 selected by the select signals receives the read command and associated address, and performs a read operation to provide the controller 102 with read data from a memory location corresponding to the associated address. The read data is provided by the selected memory 106 to the controller 102 according to a timing relative to receipt of the read command.

In preparation of the selected memory 106 providing the read data to the controller 102, the controller provides active WCK_t and WCK_c clock signals to the memory system 104. The WCK_t and WCK_c clock signals may be used by the selected memory 106 to generate an access data clock signals RDQS_t and RDQS_c. A clock signal is active when the clock signal transitions between low and high clock levels periodically. Conversely, a clock signal is inactive when the clock signal maintains a constant clock level and does not transition periodically. The RDQS_t and RDQS_c clock signals are provided by the memory 106 performing the read operation to the controller 10 for timing the provision of read data to the controller 102. The controller 102 may use the RDQS_t and RDQS_c clock signals for receiving the read data.

In operation, when a write command and associated address are provided by the controller 102 to the memory system 104, the memory 106 selected by the select signals receives the write command and associated address, and performs a write operation to write data from the controller 102 to a memory location corresponding to the associated address. The write data is provided to the selected memory 106 by the controller 102 according to a timing relative to receipt of the write command.

In preparation of the selected memory 106 receiving the write data from the controller 102, the controller provides active WCK_t and WCK_c clock signals to the memory system 104. The WCK_t and WCK_c clock signals may be used by the selected memory 106 to generate internal clock signals for timing the operation of circuits to receive the write data. The data is provided by the controller 102 and the selected memory 106 receives the write data according to the WCK_t and WCK_c clock signals, which is written to memory corresponding to the memory addresses.

Each of the memories 106(0) to 106(p) may have a mode register, which may store one or more values related to the operation of that memory 106. The values may be stored in different registers of the mode register, and may be used to store settings for the memory, enable signals, measurements, feedback, and/or other information related to the operation of the memory 106. The controller 102 may access data in a particular register through a mode register read (MRR) operation, and may write data to a register in a mode register write (MRW) operation. In one example, the clock signals WCK_t and WCK_c may need to be adjusted within one or more of the memories 106. As described herein, the memory 106 may monitor the clock signals WCK_t and WCK_c and store information in a register of the mode register. The controller 102 may retrieve this information via a MRR operation, and may determine an amount by which the clock signals should be adjusted. This adjustment value may then be written to a register of the mode register via a MRW operation. The adjustment value may act as a setting for an clock adjustment circuit of the memory 106. In another example, the process of monitoring and adjusting the clock circuit may be automatic on the memory 106, and the controller 102 may change the value of an enable register of the mode register in order to activate the process.

Figure 2:
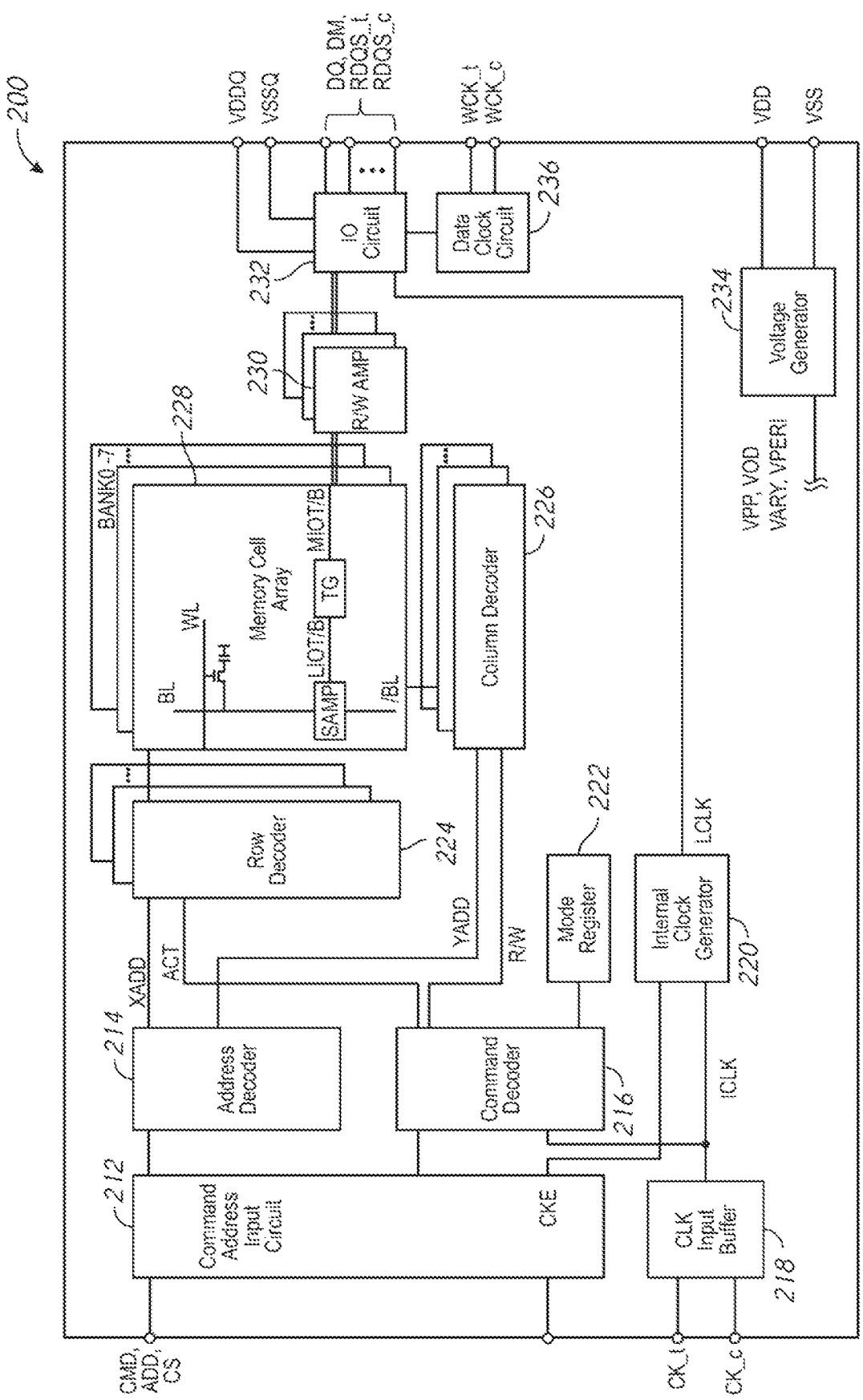
FIG. 2 is a block diagram of a memory device according to an embodiment of the present disclosure.

FIG. 2 is a block diagram of an apparatus according to an embodiment of the disclosure. The apparatus may be a semiconductor device 200, and will be referred to as such. In some embodiments, the semiconductor device 200 may include, without limitation, a DRAM device, such as low power DDR (LPDDR) memory integrated into a single semiconductor chip, for example. In some embodiments, the semiconductor device 200 may be an implementation of one or more of the memories 106 of FIG. 1.

The semiconductor device 200 includes a memory array 228. The memory array 228 is shown as including a plurality of memory banks. In the embodiment of FIG. 2, the memory array 228 is shown as including eight memory banks BANK0-BANK7. Each memory bank includes a plurality of word lines WL, a plurality of bit lines BL and /BL, and a plurality of memory cells MC arranged at intersections of the plurality of word lines WL and the plurality of bit lines BL, and /BL. The selection of the word line WIL is performed by a row decoder 224 and the selection of the bit lines BL and /BL is performed by a column decoder 226. In the embodiment of FIG. 2, the row decoder 224 includes a respective row decoder for each memory bank and the column decoder 226 includes a respective column decoder for each memory bank. The bit lines BL and /BL are coupled to a respective sense amplifier (SAMP). Read data from the bit line BL or /BL is amplified by the sense amplifier SAMP, and transferred to read/write amplifiers 230 over complementary local data lines (LIOT/B), transfer gate (TG), and complementary main data lines (MIOT/B). Conversely, write data outputted from the read/write amplifiers 230 is transferred to the sense amplifier SAMP over the complementary main data lines MIOT/B, the transfer gate TG, and the complementary local data lines LIOT/B, and written in the memory cell MC coupled to the bit line BL or BL.

The semiconductor device 200 may employ a plurality of external terminals that include command and address and chip select (CA/CS) terminals coupled to a command and address bus to receive commands and addresses, and a CS signal, clock terminals to receive clock signals CK_t and CK_c, and data clock signals WCK_t and WCK_c, and to provide access data clock signals RDQS_t and RDQS_c, data terminals DQ and DM, and power supply terminals to receive power supply potentials VDD, VSS, VDDQ, and VSSQ.

The clock terminals are supplied with external clock signals CK_t and CK_c that are provided to an input buffer 218. The external clock signals may be complementary. The input buffer 218 generates an internal clock ICLK based on the CK_t and CK_c clock signals. The ICLK clock is provided to the command decoder 216 and to an internal clock generator 220. The internal clock generator 220 provides various internal clock signals LCLK based on the ICLK clock. The LCLK clock signals may be used for timing operation of various internal circuits. Data clock signals WCK_t and WCK_c are also provided to the external clock terminals. The WCK_t and WCK_c clock signals are provided to a data clock circuit 236, which generates internal data clock signals based on the WCK_t and WCK_c clock signals. The internal data clock signals are provided to the input/output circuit 232 to time operation of circuits included in the input/output circuit 232, for example, to data receivers to time the receipt of write data.

The data clock circuit 236 may monitor and/or adjust properties of the WCK_t and WCK_c clock signals before distributing them to other components of the memory and/or generated internal data clock signals based on the WCK_t and WCK_c clock signals. The data clock circuit 236 may adjust the WCK_t and WCK_c clock signals by an amount stored as a Duty code in a register of the mode register 222. The value of the Duty code may be set to an initial value during an initialization of the device 200 before the device 200 begins operating (e.g., on power-up). During operation, the data clock circuit 236 may be activated to carry out a lookahead operation. During the lookahead operation, the data clock circuit may test one or more adjustments to the value of the Duty code and monitor if they improve the operation of the WCK_t and WCK_c clock signals (e.g., by bringing the clock signals duty cycle's closer to 50%). The value of the Duty code in the mode register 222 may then be updated based on the results of the lookahead operation. The lookahead operation may happen concurrently with operation of the device 200 (e.g., while read and/or write traffic is ongoing).

The CA/CS terminals may be supplied with memory addresses. The memory addresses supplied to the CA/CS terminals are transferred, via a command/address input circuit 212, to an address decoder 214. The address decoder 214 receives the address and supplies a decoded row address XADD to the row decoder 224 and supplies a decoded column address YADD to the column decoder 226. The CA/CS terminals may be supplied with commands. Examples of commands include timing commands for controlling the timing of various operations, access commands for accessing the memory, such as read commands for performing read operations and write commands for performing write operations, mode register write and read commands for performing mode register write and read operations, as well as other commands and operations.

The commands may be provided as internal command signals to a command decoder 216 via the command/address input circuit 212. The command decoder 216 includes circuits to decode the internal command signals to generate various internal signals and commands for performing operations. For example, the command decoder 216 may provide a row command signal ACT to select a word line and a column command signal R/W to select a bit line.

The command decoder 216 may access mode registers 222 that are programmed with information for setting various modes and features of operation for the semiconductor device 200. For example, the mode registers 222 may be programmed with information for modes related to monitoring internal data clock signals that are generated by the data clock circuit 236 based on the WCK_t and WCK_c clock signals, as well as information for modes related to changing a timing of the internal data clock signals, such as the duty cycle of the internal data clock signals. The internal data clock signals may be monitored, for example, for duty cycle distortion caused by circuits of the data clock circuit 236, and the timing of the data clock signals may be adjusted to compensate for duty cycle error, for example, caused by the circuits of the data clock circuits 236. Example information that may be stored in the mode register 222 includes an enable signal for a lookahead operation, the duty code value used to adjust the duty cycle of WCK_t and WCK_c, and/or other signals related to duty cycle monitoring and/or adjustment.

The information in the mode registers 222 may be programmed by providing the semiconductor device 200 a mode register write (MRW) command, which causes the semiconductor device 200 to perform a mode register write operation. The command decoder 216 accesses the mode registers 222, and based on the programmed information along with the internal command signals provides the internal signals to control the circuits of the semiconductor device 200 accordingly. Information programmed in the mode registers 222 may be externally provided by the semiconductor device 200 using a mode register read (MRR) command, which causes the semiconductor device 200 to access the mode registers 222 and provide the programmed information.

When a read command is received, and a row address and a column address are timely supplied with the read command, read data is read from memory cells in the memory array 228 corresponding to the row address and column address. The read command is received by the command decoder 216, which provides internal commands so that read data from the memory array 228 is provided to the read/write amplifiers 230. The read data is output to outside from the data terminals DQ via the input/output circuit 232. The RDQS_t and RDQS_c clock signals are provided externally from clock terminals for timing provision of the read data by the input/output circuit 232. The external terminals DQ include several separate terminals, each providing a bit of data synchronized with a clock edge of the RDQS_t and RDQS_c clock signals. The number of external terminals DQ corresponds a data width, that is, a number of bits of data concurrently provided with a clock edge of the RDQS_t and RDQS_c clock signals. In some embodiments of the disclosure, the data width of the semiconductor device 200 is 8 bits. In other embodiments of the disclosure, the data width of the semiconductor device 200 is 16 bits, with the 16 bits separated into a lower byte of data (including 8 bits) and a upper byte of data (including 8 bits).

When the write command is received, and a row address and a column address are timely supplied with the write command, write data supplied to the data terminals DQ is written to a memory cells in the memory array 228 corresponding to the row address and column address. A data mask may be provided to the data terminals DM to mask portions of the data when written to memory. The write command is received by the command decoder 216, which provides internal commands so that the write data is received by data receivers in the input/output circuit 232. WCK_t and WCK_c clock signals are also provided to the external clock terminals for timing the receipt of the write data by the data receivers of the input/output circuit 232. The write data is supplied via the input/output circuit 232 to the read/write amplifiers 230, and by the read/write amplifiers 230 to the memory array 228 to be written into the memory cell MC. As previously described, the external terminals DQ include several separate terminals. With reference to a write operation, each external terminal DQ receives a bit of data, and the number of external terminals DQ corresponds to a data width of bits of data that are concurrently received synchronized with a clock edge of the WCK_t and WCK_c clock signals. As previously described, some embodiments of the disclosure include a data width of 8 bits. In other embodiments of the disclosure, the data width is 16 bits, with the 16 bits separated into a lower byte of 8 bits of data and a upper byte of 8 bits of data.

The power supply terminals are supplied with power supply potentials VDD and VSS. The power supply potentials VDD and VSS are supplied to an internal voltage generator circuit 234. The internal voltage generator circuit 234 generates various internal potentials VPP, VOD, VARY, VTARGET, VPERI, and the like based on the power supply potentials VDD and VSS supplied to the power supply terminals. The internal potential VPP is mainly used in the row decoder 224, the internal potentials VOD and VARY are mainly used in the sense amplifiers SAMP included in the memory array 228, VTARGET may be a target voltage for the internal potential VARY, and the internal potential VPERI is used in many peripheral circuit blocks.

The power supply terminals are also supplied with power supply potentials VDDQ and VSSQ. The power supply potentials VDDQ and VSSQ are supplied to the input/output circuit 232. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 232 so that power supply noise generated by the input/output circuit 232 does not propagate to the other circuit blocks.

Figure 3:
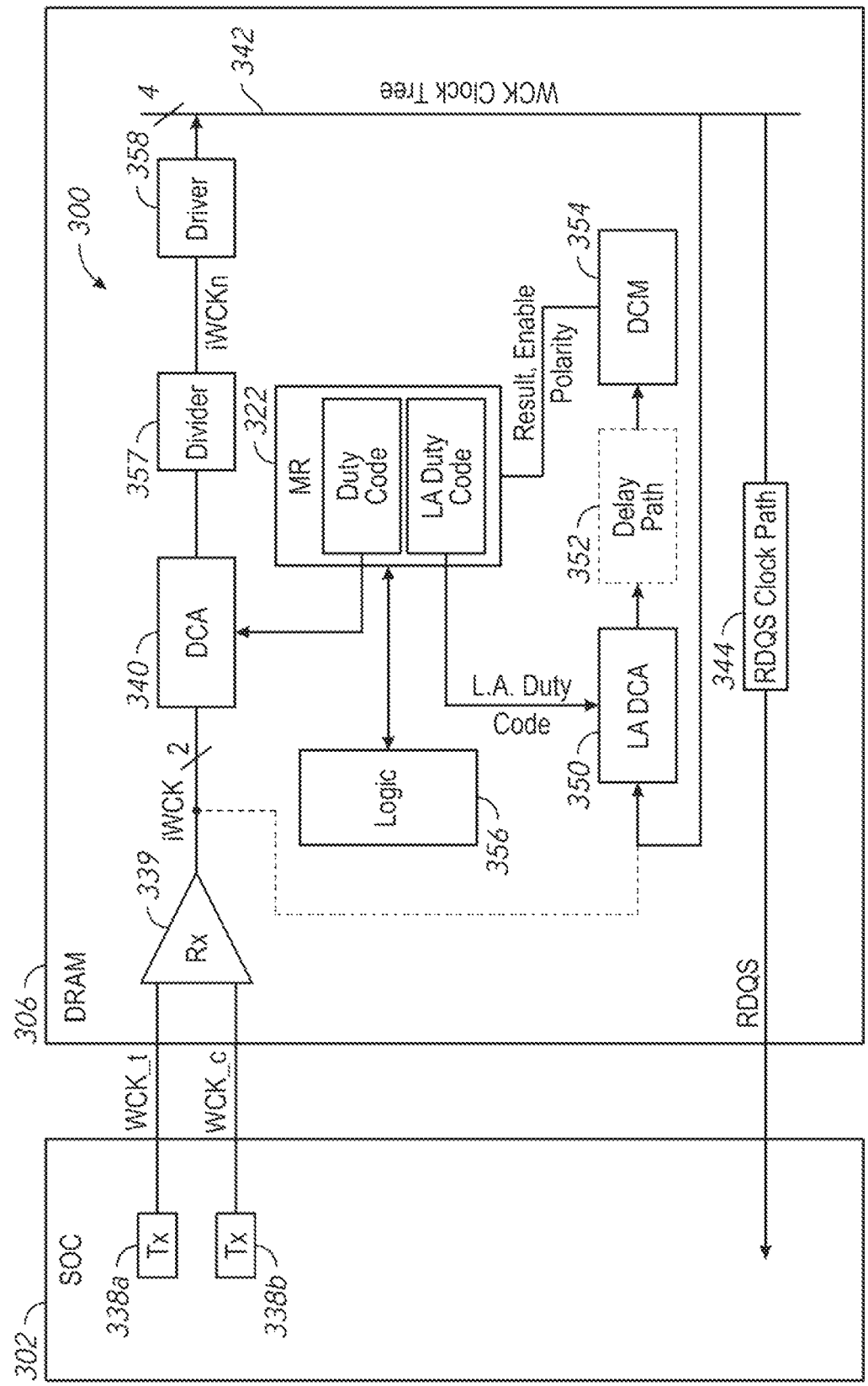
FIG. 3 is a block diagram of a duty cycle adjustment path according to an embodiment of the present disclosure.

FIG. 3 is a block diagram of a duty cycle adjustment path 300 according to an embodiment of the present disclosure. The duty cycle path 300 may be implemented on the semiconductor device 200 of FIG. 2 in some embodiments. The duty cycle path 300 may be included in a memory 306, which may be the device 200 of FIG. 2 and/or the memory 106 of FIG. 1 in some embodiments. The duty cycle path 300 may carry out a lookahead operation to determine adjustments which may to be made to the duty cycle of the clock signal (e.g., WCK_t, WCK_c). The duty cycle path 300 may operate while the memory 306 is carrying out access operations, for example, read and write operations. In some embodiments, one or more components of the duty cycle path 300 may be implemented in the data clock circuit 236 of FIG. 2.

The duty cycle path 300 may include a duty cycle adjustor (DCA) 340 which adjusts an internal clock signal iWCK based on the value of a Duty Code register of a mode register 322. A receiver 339 of the memory 306 receives the clock signals WCK_t and WCK_c and provides internal clock signals iWCK. There may be two complementary internal clock signals iWCK (e.g., corresponding to WCK_t and WCK_c), however, for the sake of clarity, except in situations where they undergo separate operations or couplings, iWCK may be used to refer to both of the internal clock signals. The duty cycle adjustor 340 provides the adjusted clock signal to a divider 357 which may generate one or more additional clock signals iWCKn (where n is some number) and provide iWCKn to the WCK clock tree 342, which in turn may provide the adjusted clock signal to one or more components of the memory 306, such as a DQS clock path 344. The adjusted clock signal is also provided to a second duty cycle adjustor circuit, which may be referred to as a lookahead duty cycle adjuster circuit (LA DCA) 350. Similar to the internal clock signals iWCK, except in situations where they are used or coupled separately, iWCKn may be generally used to refer to all of the iWCKn clock signals.

The LA DCA 350 adjusts the adjusted clock signal by an amount determined by the value of a second duty code in a register of the mode register 322. For purposes of clarity, the second duty code may generally be referred to as a 'lookahead' (or look-ahead) duty code. The look-ahead DCA 350 may provide the adjusted clock signal (optionally through a delay path 352) to a duty cycle monitor (DCM) 354. The DCM 354 may monitor the duty cycle of the adjusted clock signal and provide a result signal to the mode register 322. The mode register 322 may be coupled to logic circuits 356, which may receive the result from the DCM 354 and/or access values of the mode register 322. In some embodiments, the logic 356 may be located off of the memory 306 (e.g., in the controller 102 of FIG. 1). In some embodiments, the logic 356 may be a component of the memory 306.

The WCK_t and WCK_c clock signals are provided to the memory 306 by a system-on-chip (SOC) 302, which may represent one or more components coupled to the memory 306 (e.g., the other components of the system 100 of FIG. 1. The SOC 302 includes transmitters (Tx) 338a,b which provide the WCK_t and WCK_c clock signals to a receiver 339 of the memory 306. The receiver 339 in turn provides the internal iWCK clock signals to one or more components of the memory 306. The SOC 302 may include a controller which may provide one or more signals to the memory 306 and/or perform one or more operations (e.g., MRR/MRW) on the memory 306. The controller may be coupled to the mode register 322, and may use MRR and MRW operations to monitor the status of the memory 306 and/or perform operations, such as a lookahead operation as described herein.

The receiver 339 provides the iWCK clock signal to the DCA 340. The iWCK clock signals may be two clock signals which are complementary to each other. The DCA 340 may adjust a duty cycle of one or more of the iWCK clock signals based on the value of a Duty Code stored in a register of the mode register 322. The duty code may have an initial value which is determined during an initialization process of the memory device. The Duty Code may indicate an amount of delay which is applied to the clock signal in order to adjust a duty cycle of the WCK clock.

The DCA 340 may provide the adjusted clock signal to a divider 357, which may generate one or more additional clock signals iWCKn based on the adjusted clock signal. Since the iWCKn clock signals are based on the adjusted clock signal provided by the DCA 340, the iWCKn clock signals may also be considered to be adjusted clock signals. The iWCKn clock signals may pass through a driver 358, which may modulate the iWCKn clock signals (e.g., by increasing a voltage and/or current of the signals). In some embodiments, there may be four iWCKn clock signals (e.g., iWCK1, iWCK2, iWCK3, iWCK4) each of which may have a phase which is offset by 90° from the adjacent signals (e.g., iWCK1 is 90° ahead of iWCK2 and 90° behind iWCK4). Accordingly, there may be two pairs of complementary iWCKn clock signals (e.g., iWCK1 and iWCK3, and iWCK2 and iWCK4).

The iWCKn clock signals may be provided to the WCK clock tree 342, which may distribute the iWCKn clock signals to one or more additional components of the memory 306. Although only a single divider 357 and driver 358 are shown, the memory 306 may have multiple dividers and drivers. For example, in some embodiments there may be an additional divider and driver coupled between the LA DCA 350 and the delay path 352.

The iWCKn clock signals are provided by the WCK clock tree 342 to the LA DCA 350, which adjusts the clock signal based on the lookahead duty code in the mode register 322, as previously described. In some embodiments, the receiver 339 may be coupled to both the DCA 340 and the LA DCA 350 in parallel such that both the DCA 340 and the LA DCA 350 receive the iWCK clock signals. In some embodiments, the LA DCA 350 may receive one or more of the iWCKn clock signals from the WCK clock tree 342. An embodiment where the LA DCA 350 receives the iWCKn clock signals from the WCK clock tree 342 (e.g., after iWCKn has been adjusted by the DCA 340) is discussed in more detail in FIG. 7. An embodiment where the DCA 340 and the LA DCA 350 both receive the iWCK clock signals from the receiver 339 is discussed in more detail in FIG. 8.

As indicated by the dotted lines, in an embodiments where the LA DCA 350 is coupled to the iWCK clock signals in parallel with the DCA 340, a delay path 352 may be provided between the LA DCA 350 and the DCM 354. The delay path 352 may be an optional component, and may not be used in some components. The WCK clock tree 342 may be associated with a delay (e.g., an RC delay). The delay path 352 may be a model of the delay along the WCK clock tree 342. The delay path 352 may also model the time delay and/or behavior of the divider 357 and/or driver 358. In some embodiments the delay path 352 may generate one or more of the iWCKn clock signals from the adjusted iWCK clocks provided by the LA DCA 350. In some embodiments, the LA DCA 350 may be coupled to iWCKn through the WCK clock tree 342, and the LA DCA 350 may be coupled to the DCM 354 without the delay path 352 in between.

The DCM 354 may monitor the duty cycle of the iWCKn clock signals. In some embodiments, the DCM 354 may monitor only selected ones of the iWCKn clock signals. For example, the DCM 354 may selectively monitor a pair of complementary clock signals (e.g., iWCK1 and iWCK3). The DCM 354 may use a complementary pair of the iWCKn clock signals to determine the duty cycle of the iWCKn clock signals. The DCM 354 may provide a result signal Result. Result may be a binary signal which may indicate whether the duty cycle of WCK is above or below 50%. The DCM 354 may also have one or more control signals, which may be provided by the mode register 322. For example, the DCM 354 may have a polarity and an enable signal, which may have values stored in registers of the mode register 322.

The mode register 322 may store values associated with a lookahead operation. Registers for the duty code and the lookahead (LA) duty code are both shown in the example of FIG. 3, however it is to be understood that the mode register may contain other registers associated with the lookahead operation as described herein. For example, the mode register 322 may also contain registers for an enable signal, a polarity of the DCM 354, and one or more results from the DCM 354. The mode register 322 may be coupled to a controller (e.g., controller 102 of FIG. 1) via a command decoder (e.g., command decoder 216 of FIG. 2) of the memory 306. Values in the registers of the mode register 322 may be read or written by the controller. In some embodiments, the logic 356 may also be able to read and/or write values to registers of the mode register.

In general, during a lookahead operation the duty cycle adjustment path 300 may test one or more adjustments for the clock signal WCK and then update the duty code based on the monitored results of the tested adjustments. The testing may occur along a path which does not interfere with the operation of the memory 306, such that access operations, such as read and write operations, may continue while the lookahead operation is performed. During the lookahead operation the LA DCA 350 may adjust the clock signal WCK (which may or may not have already been adjusted by DCA 340). The mode register 322 may contain a lookahead duty code which may indicate the amount by which the LA DCA 350 adjusts the clock WCK. The lookahead duty code may be adjusted by the controller and/or the logic 356 to provide a plurality of different possible adjustments to WCK. The DCM 354 may monitor the adjusted WCK and provide the signal result, which may determine when the adjusted WCK has a duty cycle of about 50%. The value of the lookahead duty code that yielded an adjusted WCK with a duty cycle of about 50% may be saved as a duty code adjustment value. In some embodiments, the DCM 354 may have an offset voltage and it may be necessary to flip a polarity of the DCM 354 and repeat the sequence of lookahead duty codes for each polarity in order to cancel out the offset voltage. The value of the duty code may be updated based on the saved duty code adjustment value(s). In this manner, an adjustment to the duty code may be determined.

The lookahead operation may be repeated on a regular or semi-regular basis. In some embodiments, the controller (e.g., controller 102 of FIG. 1) may change an enable value in the mode register 322 to begin the lookahead operation. The controller may change the enable value based on a timer of the circuit. In one example, the controller may change the enable value every 100 msec. In other examples, the controller may activate a lookahead operation responsive to one or more command signals.

The controller may update the duty code based on the duty code adjustment value based on a timing determined by the controller. For example, the controller may monitor traffic (e.g., read and write traffic) in the memory 306 and may update the duty code based on the duty code adjustment value during a pause in the traffic. In some embodiments, the controller may wait for a 'natural' pause in the traffic when less (or no) read or write commands are being issued to the memory 306. In some embodiments, the controller may pause traffic in order to update the duty code.

In some embodiments, there may be an upper and a lower data path. While for brevity only a single duty cycle adjustment path 300 has been shown and discussed, it should be understood that in some embodiments certain components of the path 300 may be repeated for the upper and lower byte. For example, there may be an upper duty cycle adjuster (DCAU) and a lower duty cycle adjuster (DCAL).

Figure 4:
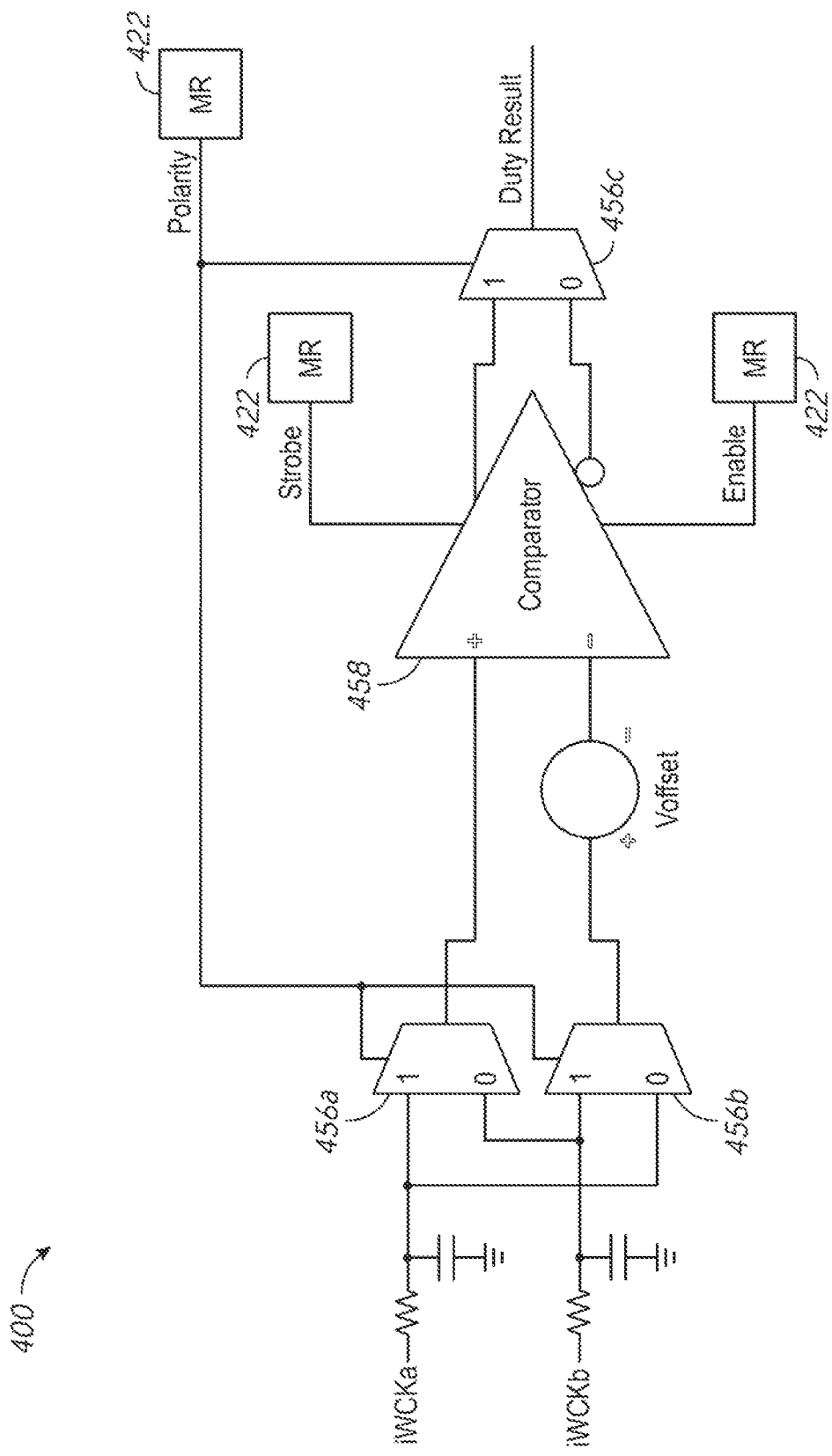
FIG. 4 is a schematic diagram of a duty cycle monitor according to an embodiment of the present disclosure.

FIG. 4 is a schematic diagram of a duty cycle monitor according to an embodiment of the present disclosure. The duty cycle monitor (DCM) 400 may be used as the DCM 354 of FIG. 3 in some embodiments. The DCM 400 may be used to determine the duty cycle of the clock signals iWCKa and iWCKb. The clock signals iWCKa and iWCKb may be complementary clock signals which have been adjusted by (and/or based on signals adjusted by) the DCA (e.g., DCA 340 of FIG. 3) and/or the LA DCA (e.g., LA DCA 350 of FIG. 3). The DCM 400 may provide a signal 'duty result' which may indicate when one of the received input signals (e.g., the clock signals) has a greater duty cycle than the other. The DCM 400 may include a comparator 458 and a series of multiplexers 456a-c. The comparator 458 and/or multiplexers 456a-c may be coupled to one or more registers of a mode register 422.

Each of the multiplexers 456a-c may receive a first and a second input signal, and provide one of the input signals in response to a command signal. The command signal may be a binary signal, such that the multiplexer 456a-c may provide the first input when the command signal is a logical high (e.g., '1', Vdd) and may provide the second input when the command signal is a logical low (e.g., '0', ground). The first multiplexer 456a is coupled to the clock signal iWCKa as a first input, and to the clock signal iWCKb as a second input. In some embodiments, the two clock signals iWCKa and iWCKb may be provided by a WCK clock tree (e.g., WCK clock tree 342 of FIG. 3) and may be a pair of the iWCKn clock signals which are complementary to each other. In some embodiments, the clock signals iWCKa and iWCKb may be provided by a delay path (e.g., delay path 352 of FIG. 3) and may mimic the clock signals iWCKn in the WCK clock tree.

The second multiplexer 456b is coupled to the clock signal iWCKa as a first input and the clock signal iWCKb as a second input. Both the first and second multiplexers 456a, b may be coupled to a register of the mode register 422 which contains a polarity signal as the command signal. Accordingly, responsive to the polarity register being in a first state (e.g., a logical high), the first multiplexer 456a provides the clock signal iWCKa, and the second multiplexer 456b provides the clock signal iWCKb. When the Polarity register is in a second state (e.g., a logical low), the signals may be reversed, and the first multiplexer 456a may provide the clock signal iWCKb while the second multiplexer 456b provides the clock signal iWCKa.

The comparator 458 provides an output based on the relative status of a first input (here noted as '+') and a second output ('−'). The first input is coupled to the output of the first multiplexer 456a. The second input is coupled to the output of the second multiplexer 456b. Accordingly, the status of the polarity register of the mode register 422 determines if the clock signal iWCKa is provided to the first input of the comparator 458 while the clock signal iWCKb is provided to the second input, or vice versa. The comparator 458 is shown as having an offset voltage Voffset along the second input. The Voffset shown in FIG. 4 may model a random offset of the comparator 458. The Voffset is shown to model an offset voltage of the comparator 458 and is not included as an actual circuit or component of the DCM 400, however.

The comparator 458 is also coupled to registers of the mode register 422. In particular the comparator 458 is coupled to a strobe register and to an enable register. The enable register may be used to activate the comparator 458, e.g., when the enable register is in a first state (e.g., a high logical level) the comparator 458 may provide a result based on the state of the inputs, whereas when the enable register is in a second state (e.g., a low logical level) the comparator 458 may not provide a result.

The third multiplexer 456c has a first input coupled to the result signal provided by the comparator 458. The second input of the third multiplexer 456c is coupled to an inverse of the result signal provided by the comparator 458. The third multiplexer 456c is coupled to the polarity register of the mode register 422 as a command signal. The overall result signal 'duty result' of the DCM 400 is provided by the third multiplexer 456c.

The DCM 400 may monitor changes between the duty cycle of the clock signals iWCKa and iWCKb. When the duty cycle is less than 50%, the signal 'duty result' may be a first logical value, and when the duty cycle is greater than 50%, the signal 'duty result' may be a second logical value. Accordingly, as the iWCK clocks are adjusted, the duty result may switch from the first logical value to the second logical value. The point where the duty result switches may indicate that the WCK clock has been adjusted to a duty cycle of approximately 50%.

The value of the polarity register may be used to flip which of the clock signals WCK_t, WCK_c is along which output of the comparator 458. By testing the duty cycle and then switching the state of the Polarity register and repeating the test, the random offset of the comparator 458 (modeled by the offset voltage Voffset) may be canceled out. The results from the two tests may be combined (e.g., averaged) to cancel the effects of Voffset on the results.

Figure 5:
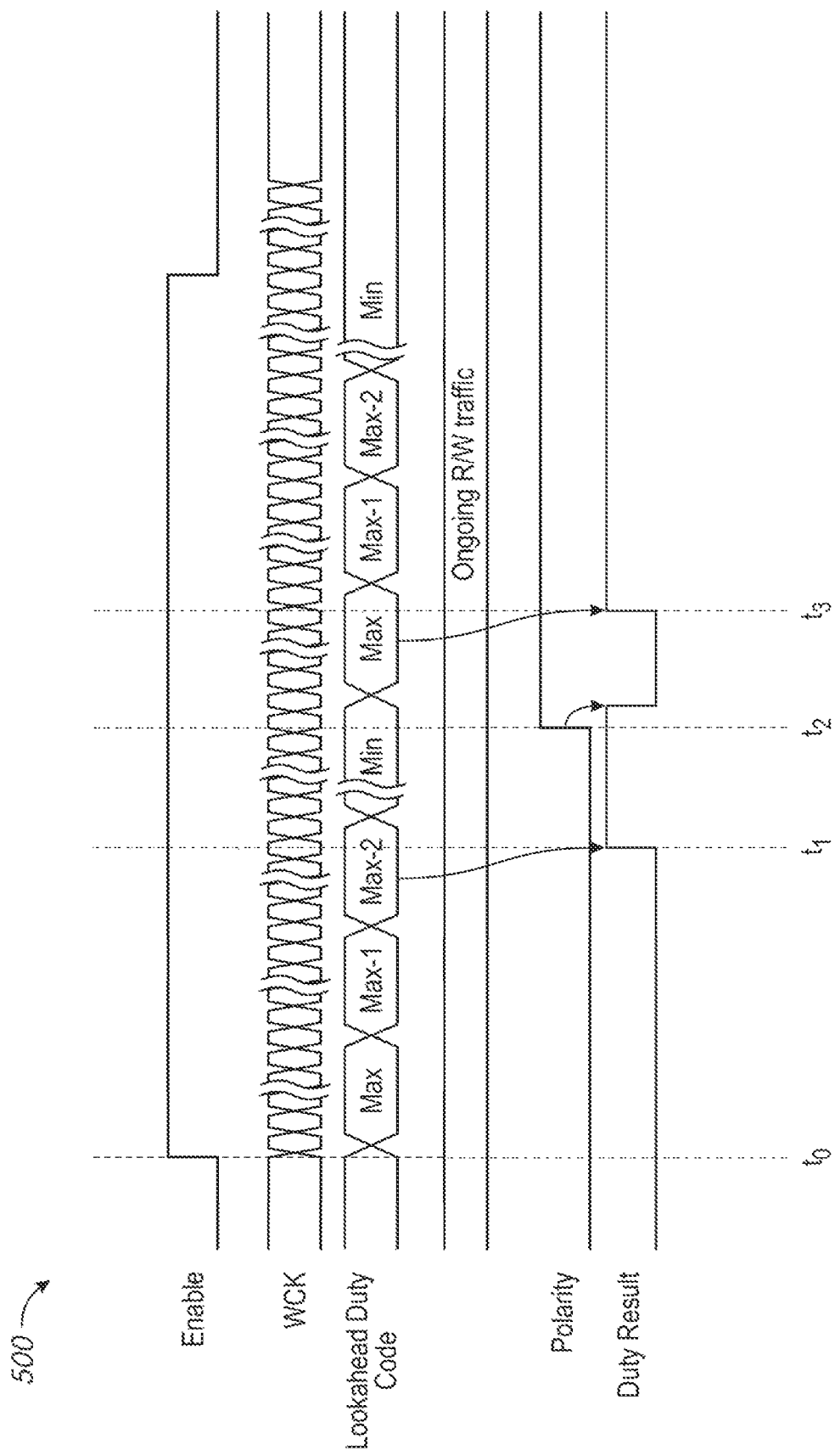
FIG. 5 is a timing chart of the operation of duty cycle adjustment according to an embodiment of the present disclosure.

FIG. 5 is a timing chart of the operation of duty cycle adjustment according to an embodiment of the present disclosure. The timing chart 500 may represent the operation of one or more signals and/or registers of a mode register of the duty cycle adjustment path 300 of FIG. 3. In particular, the signals of the timing chart 500 may represent a lookahead operation. Although a particular series of signals with a particular series of waveforms are shown, it is to be understood that these are meant to be illustrative of an example operation, and not limiting. For example, other embodiments might use more or less signals or might use signals with different patterns of operation.

The first line of the timing chart 500 shows a signal 'enable' which activates a look-ahead operation. The enable signal may be a value stored in a register of a mode register. At a first time t0, enable may switch from a logical low to a logical high, which may activate a DCM (e.g., the DCM 400 of FIG. 4) to begin providing the signal 'duty result' based on the clock signals WCK_t and WCK_c. At time t0 the value of the lookahead duty code may also begin changing. In some embodiments the controller (e.g., controller 102 of FIG. 1) may change both the value of enable and the value of the lookahead duty code over time. In some embodiments, the controller may change the value of enable and internal logic of the memory device (e.g., logic 356 of FIG. 3) may change the value of the lookahead duty code.

The second line of the timing chart 500 shows the WCK clock. Waveforms corresponding to both WCK_t and WCK_c are shown. The WCK clock signals may alternate between high and low values, with the WCK_c complementary to the WCK_t. The WCK clock signals may be continuously active throughout a lookahead operation. In some embodiments, the WCK clock may be paused (along with read and write traffic) when the value of the duty code is updated responsive to the lookahead operation.

The third line of the timing chart 500 shows the values of a lookahead duty code, which may be provided to a lookahead DCA (e.g., the LA DCA 350 of FIG. 3). The lookahead duty code may have a sequence of values which are changed over time. In some embodiments, the lookahead duty code may be a value in a register of the mode register (e.g., mode register 322 of FIG. 3) and may be changed by a controller (e.g., controller 102 of FIG. 1). In some embodiments, the lookahead duty code may be updated in the mode register by internal components of the memory device (e.g., logic 356 of FIG. 3).

The lookahead duty code may have a maximum value Max and a minimum value Min. The lookahead duty code may also have one or more values between Max and Min. Each of the values of the lookahead duty code may correspond to a different amount of adjustment that the LA DCA applies to the WCK clock. As shown in the example timing chart 500, the lookahead duty code may decrease from a maximum value Max to a minimum value Min over time. At certain timing intervals, the value of the lookahead duty code may decrement such that the values go from Max to Max-1, to Max-2, etc. until Min is reached. In some embodiments, the lookahead duty code may instead increase from the Min to the Max in a similar manner. In some embodiments, the lookahead duty code does not necessarily follow a specific sequence or pattern of values, and the values may occur in any order. Once the lookahead duty code has reached an end of its cycle (e.g., has decremented from Max to Min), the lookahead duty code may reset to its initial value (e.g., back to Max) and the cycle may continue.

The fourth line of the timing chart 500 shows a representation of read and write (R/W) signals in the memory device. The fourth line is intended to represent that read and write operations (e.g., R/W traffic) continues throughout the process of lookahead operation.

The fifth line of the timing chart 500 shows the value of the polarity, which may be a value stored in a register of a mode register. The polarity may operate a DCM (e.g., DCM 400 of FIG. 4) to swap which clock signal (e.g., WCK_t, WCK_c) is provided to each input of the DCM. As shown, at a time t2, Polarity switches from a low logic level to a high logic level.

The sixth line shows the signal 'duty result' which is provided by the DCM (e.g. the DCM 400 of FIG. 4). The duty result may transition from a first logic level to a second logic level based on a comparison between the clock signal WCK_t and the clock signal WCK_c. In particular, the duty result may transition when the duty cycle of the clock signal changes from less than 50% to greater than 50%. At time t1 and t3, when the duty result transitions, the duty cycle of the WCK clock may be approximately 50%.

When a lookahead operation is initiated at a time t0, enable is switched from a low logical level to a high logical level. This may activate a DCM, as well as begin the sequence of the lookahead duty code. The LA DCA may adjust the WCK clock by an amount corresponding to the lookahead duty code. At a time t1, duty result transitions from a low logical level to a high logical level. This may indicate that the clock signal adjusted by the lookahead DCA (e.g., lookahead DCA 350 of FIG. 3) has transitioned from below a 50% duty cycle to above a 50% duty cycle. This implies that the lookahead duty code at the time t1 has yielded an adjusted WCK clock with an approximately 50% duty cycle. The rising edge of the duty result may cause the current value of the lookahead duty code (in this example Max-2) to be saved in a register of the mode register as a first lookahead result.

The DCM (and/or other components of the lookahead path) may have random voltage offsets and/or hysteresis which may affect the result of the DCM based on, for example, which clock signal iWCKa, iWCKb is coupled to which input of the DCM. Accordingly, at time t2, the Polarity switches from a first logical level to a second logical level (in this case, from low to high). The time t2 may be chosen to occur after the lookahead duty code has expressed every value of the lookahead duty code at least once (e.g., after the lookahead duty code reaches the minimum value Min). In some embodiments, the polarity may be changed responsive to the value of the lookahead duty code. In some embodiments, the lookahead duty code may operate on a known timing, and the change of the polarity may be timed to alternate based on the known timing of the lookahead duty code.

As discussed in regards to FIG. 4, this may swap which clock signal is coupled to which input of the DCM. As may be seen from the DCM 400 of FIG. 4, it also inverts the output of the DCM. Thus, as may be seen from the duty result in the timing chart 500, shortly after t2, the duty result switches from a high logical level to a low logical level. This may allow for rising edges of the duty result to be used a result.

Shortly after the time t2, the lookahead duty code may restart and begin counting down from Max to Min a second time. At a time t3, the value of Duty Cycle may change from a low to a high logical level. As with the time t1, this may indicate that the clock signal adjusted by the lookahead duty code has a duty cycle of approximately 50%. The current value of the lookahead duty code at the time t3 may be saved to a register of the mode register as a second lookahead result. In the example timing chart of FIG. 5, the value at time t3 is the maximum value Max.

As discussed, the values of the first and second lookahead result recorded at the first polarity and the second polarity respectively may be different values due to offset voltages, hysteresis, etc. In this case, the system will have saved two values Max-2 and Max to different registers of the mode register. Logic of the circuit (e.g., logic 356 of FIG. 3 and/or controller 102 of FIG. 1) may take an average of the values as a duty cycle adjustment value and may save that value in another register of the mode register. In this case the duty cycle adjustment value would be Max-1. The duty code coupled to the duty cycle adjuster (e.g., duty cycle adjuster 340 of FIG. 3) may be adjusted based on the duty cycle adjustment value.

The lookahead operation may be activated by changing the value of enable to a high logical value (or stopped by changing enable to a low logical value). The value of enable may be automatically changed (e.g., by controller 102 of FIG. 1) in order to automatically carry out the lookahead operation. The value of enable may be reset to a low logic once the lookahead duty code has cycled (e.g., expressed all values from Max to Min) twice. In some embodiments, the lookahead operation may be repeated at periodic intervals. In one example, the lookahead operation may be carried out every 100 ms.

Figure 6:
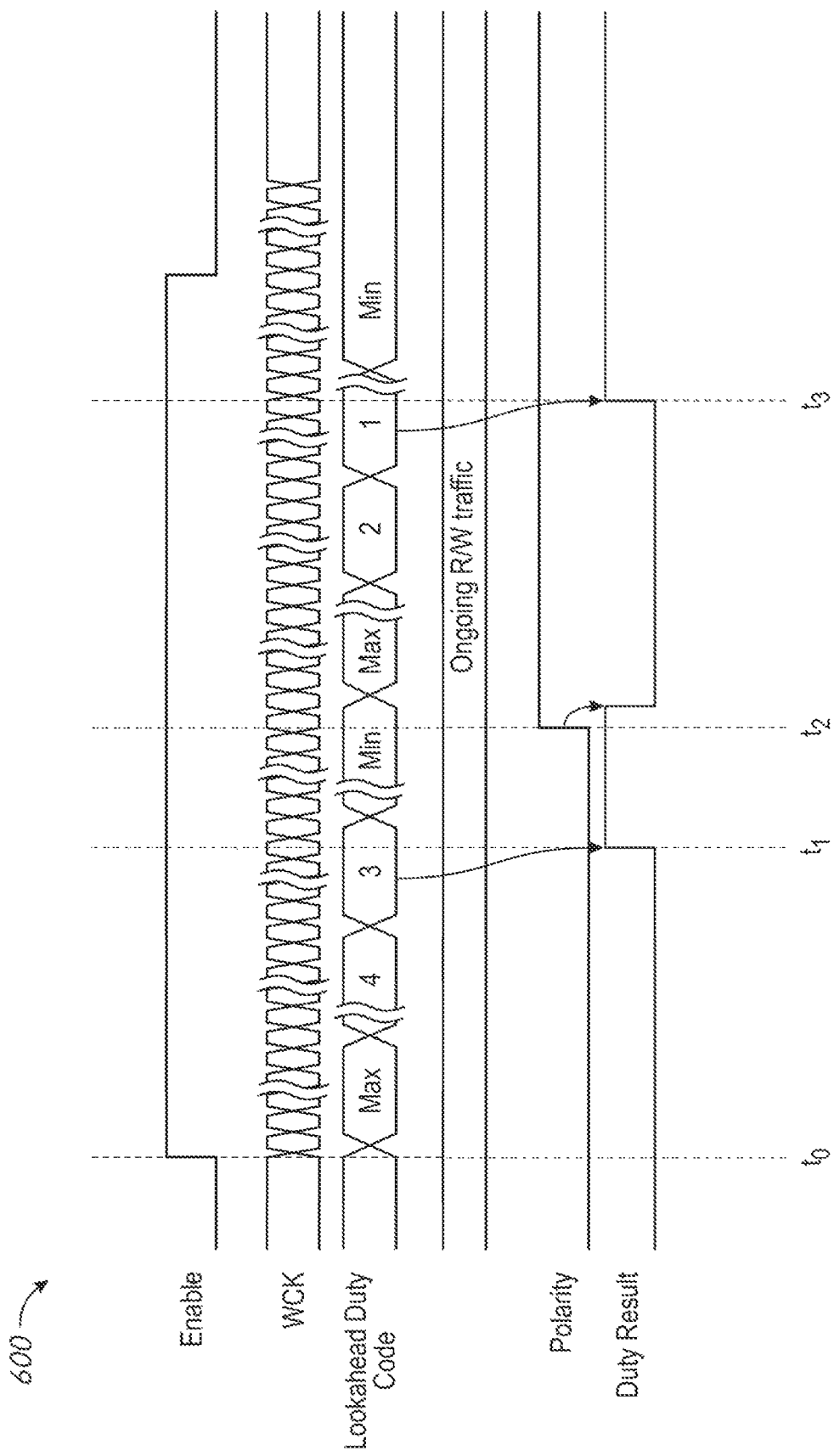
FIG. 6 is a timing chart of an example of duty cycle adjustment according to an embodiment of the present disclosure.

FIG. 6 is a timing chart of an example of duty cycle adjustment according to an embodiment of the present disclosure. The timing chart 600 may be similar to the timing chart 500, except that the timing chart 600 may show an example with specific values of the lookahead duty code. In particular, the lookahead duty code may cycle from a maximum value of +7 to a minimum value of −7. Table 1 (below) shows the potential operation of the look-ahead DCA circuit in response to the duty code.

TABLE 1

Example Effects of Duty Cycle Adjustor Codes

| DCA Code | Duty Cycle Adjuster step(pS) | Cumulative Duty Cycle effect(pS) |
|---|---|---|
| 7 | 6.0 | 25.8 |
| 6 | 5.0 | 19.9 |
| 5 | 4.1 | 14.9 |
| 4 | 3.5 | 10.7 |
| 3 | 2.9 | 7.3 |
| 2 | 2.4 | 4.4 |
| 1 | 2.0 | 2.0 |
| 0 | 0.0 | 0.0 |
| −1 | −2.0 | −2.0 |
| −2 | −2.4 | −4.4 |
| −3 | −2.9 | −7.3 |
| −4 | −3.5 | −10.7 |
| −5 | −4.1 | −14.9 |
| −6 | −5.0 | −19.9 |
| −7 | −6.0 | −25.8 |

The first column of Table 1 shows the value of the possible values of the lookahead duty code from +7 to −7. The second and third column may express a delay time applied by the DCA, and are shown in units of picoseconds (psec or pS) in Table 1. The second column of Table 1 shows the relative increase between each value of the lookahead duty code, while the third column may represent the total (e.g., cumulative) adjustment represented by the values. Thus, a value of 0 may indicate no adjustment. The lookahead DCA may not have a linear response relative to the values of the lookahead duty code, and thus as may be seen from the second column, while a value of 1 may correspond to a delay which is 2.0 pS longer than a delay corresponding to a value of 0, a value of 2 may correspond to a delay which is 2.4 pS longer than a delay corresponding to a value of 1. Accordingly, a value of 2 may correspond to a total adjustment of 4.4 pS applied to the iWCK clock signals (or iWCKn clock signals) by the LA DCA.

In the example of FIG. 6, the time t1 (when the duty result transistors for a first time) occurs when the value of the lookahead duty code is 3. The time t3 (when the duty result transitions for the second time) occurs when the value of the lookahead duty code is 1. By taking an average of these values, a duty cycle adjustment of +2 may be determined. This may indicate that adjusting duty code by +4.4 pS yields an adjusted clock signal with a duty cycle of approximately 50%. The lookahead duty code of +2 may be saved in a register of the mode register as the duty cycle adjustment.

In some embodiments, the value of the lookahead duty code and the duty code may not match. Thus, the duty cycle adjustment value may need to be translated to match the operation of the DCA. In some embodiments, the value of the delay corresponding to the duty cycle adjustment value may be saved rather than the duty cycle adjustment value itself. In some embodiments, the duty cycle adjustment value may be added to (or subtracted from) the value of the duty code. In some embodiments the duty cycle adjustment value may replace the duty code.

Figure 7:
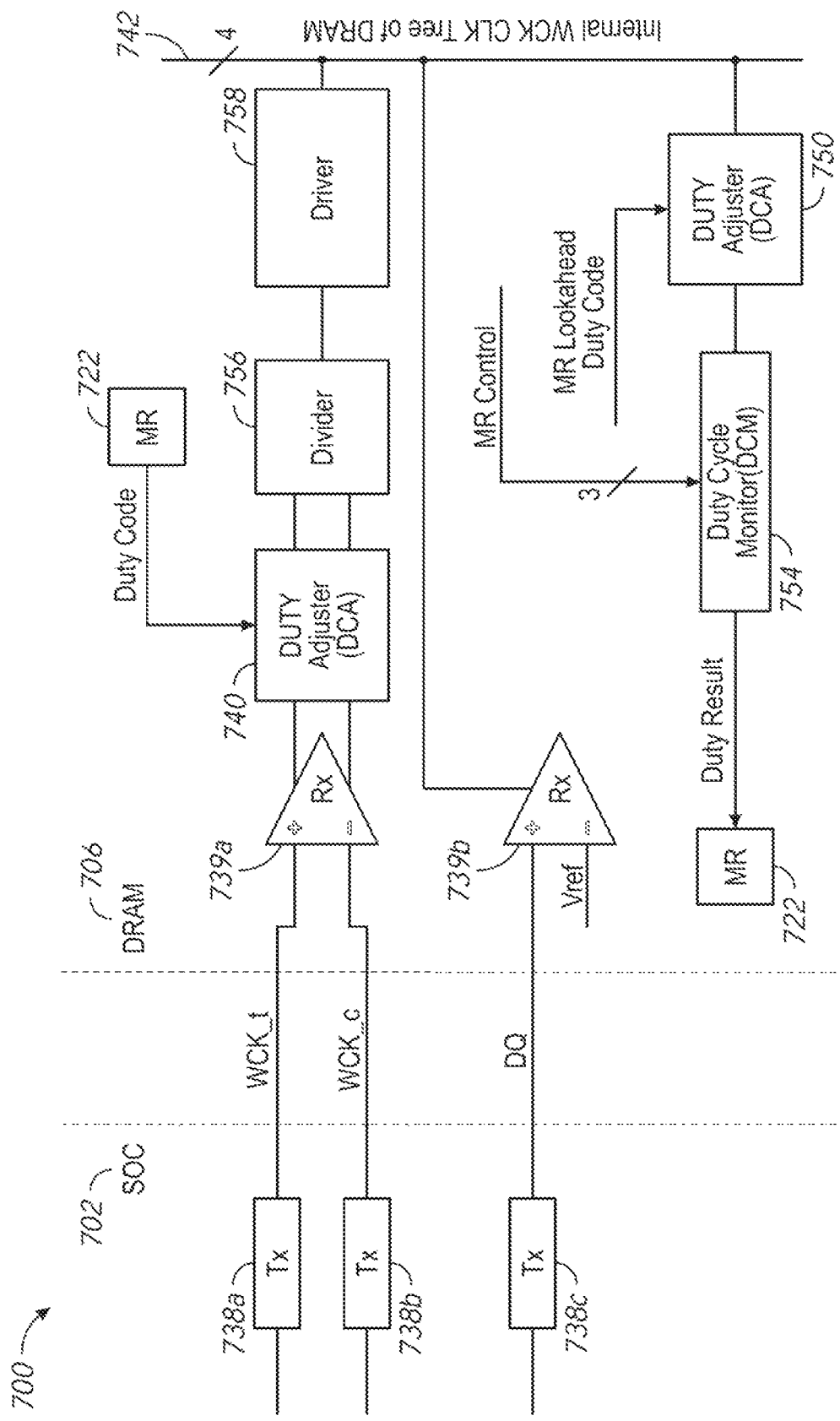
FIG. 7 is a block diagram of a duty cycle adjustment path according to an embodiment of the present disclosure.

FIG. 7 is a block diagram of a duty cycle adjustment path according to an embodiment of the present disclosure. The duty cycle adjustment path 700 may be an implementation of the duty cycle adjustment path 300 of FIG. 3. The duty cycle adjustment path 700 includes a system-on-chip (SOC) 702 coupled to a memory 706. The SOC 702 may have transmitters (Tx) 738a-c which provide one or more clock signals to receivers 739a and further provide data DQ to the receiver 739b of the memory 706. The clock signals are provided to a DCA 740, which adjusts the signal(s) based on a Duty code provided by a register of a mode register 722. The adjusted clock signal is provided to an internal WCK clock tree 742. A lookahead DCA (LA DCA) 750 is also coupled to the internal WCK clock tree 742. The LA DCA 750 may adjust a clock signal based on a lookahead duty code which is a value stored in a register of a mode register 722. The LA DCA 750 provides the adjusted code to a DCM 754. The DCM is operated by one or more parameters stored in registers of the mode register 722, and provides a signal duty result to a different register of the mode register 722.

The SOC 702 may have transmitters 738a-c that may provide the WCK_t and WCK_c clock signals as well as data DQ to the memory 706. The WCK clock signals are provided to the receiver 739a, which is coupled to the DCA 740. The signal DQ is provided to receiver 739b which also receives a reference voltage Vref, and provides internal data signals that may be provided, for example, to other circuits of the memory 706. Timing of the operation of the receiver 739b may be controlled by the clock provided by the WCK clock tree 742. The DCA 740 may provide an adjusted clock signal to a divider 756 and driver 758, which couple the adjusted clock signal to the WCK clock tree 742.

The DCA 740 may adjust the clock signals before providing them to the internal WCK clock tree 742. The amount that the clock signal is adjusted may be determined by a Duty code which is stored in register of the mode register 722. The Duty code may be a value which is determined during an initialization of the memory device and stored in a register of the mode register.

The lookahead DCA 750 may receive the clock signal from the WCK clock tree 742 which has been adjusted by the DCA 740. The lookahead DCA 750 may apply a further adjustment to the duty cycle of the clock signal. The amount of adjustment performed by the lookahead DCA 750 may be based on the value of a lookahead duty code which may be stored in a register of a mode register 722.

Accordingly, the lookahead DCA 750 provides a signal to the DCM 754 which has been adjusted by both the lookahead DCA 750 and the DCA 740. The DCM 754 may receive one or more control signals (e.g., Polarity, enable, as shown in FIGS. 5-6) from registers of the mode register 722. When the DCM 754 is activated, the DCM 754 may provide a signal duty result which may be stored in a register of the mode register 722.

In the duty cycle adjustment path 700, the DCA 740, the lookahead DCA 750, and the DCM 754 are all coupled to different registers of the mode register 722. Thus, the values in the mode register 722 may control the operation of the lookahead operation. A controller (which may be a part of the SOC 702) may access values in the mode register 722 through mode register read operations (MRR) and may write new values to the mode register 722 via a mode register write (MRW) operation. The controller may activate a lookahead operation by changing the value of enable in the mode register 722 with a MRW operation. The controller may do this in response to an external command or in response to logic (e.g., periodically change the value in response to a timer).

During a lookahead operation, the controller may use MRR operations to monitor the duty result. At the same time, the controller may use MRW operations to periodically change the value of the lookahead duty code. The controller may initialize the lookahead duty code to an initial value Max, and then update it to a value Max-1 and so on until a value Min is reached. By monitoring duty result throughout this process, the controller may save the value of the lookahead duty code when duty result changes with a MRW operation to a new register of the mode register 722. Once the lookahead duty code has reached the value Min, the controller may use a MRW operation to change a value of Polarity in the mode register 722. The controller may then reset the lookahead duty code to a value of Max and repeat the process of decrementing to Min. As before, the controller monitors duty result throughout via MRR operations, and uses an MRW operation to record the value of the lookahead duty code to a new register when the duty result changes. The controller may then use MRR operations to check the values of the two saved duty result values, and take an average, which may be stored by a MRW operation in a duty cycle adjustment register.

The controller may use a MRR to retrieve the value of the duty cycle adjustment register, and then use an MRW operation to update the value of the Duty code register, based on the value of the duty cycle adjustment register. In some embodiments, the controller may also use an MRR operation to retrieve the value of the Duty code register, and update the Duty code value based on both the current value of the Duty code and the value of the duty cycle adjustment. The controller may be prompted to check duty cycle adjustment and update the Duty code, or may automatically (e.g., periodically) update the Duty code. In some embodiments, the controller may schedule various operations, and may wait to update the Duty code until certain conditions are met (e.g., a lull in traffic to the memory 706).

Figure 8:
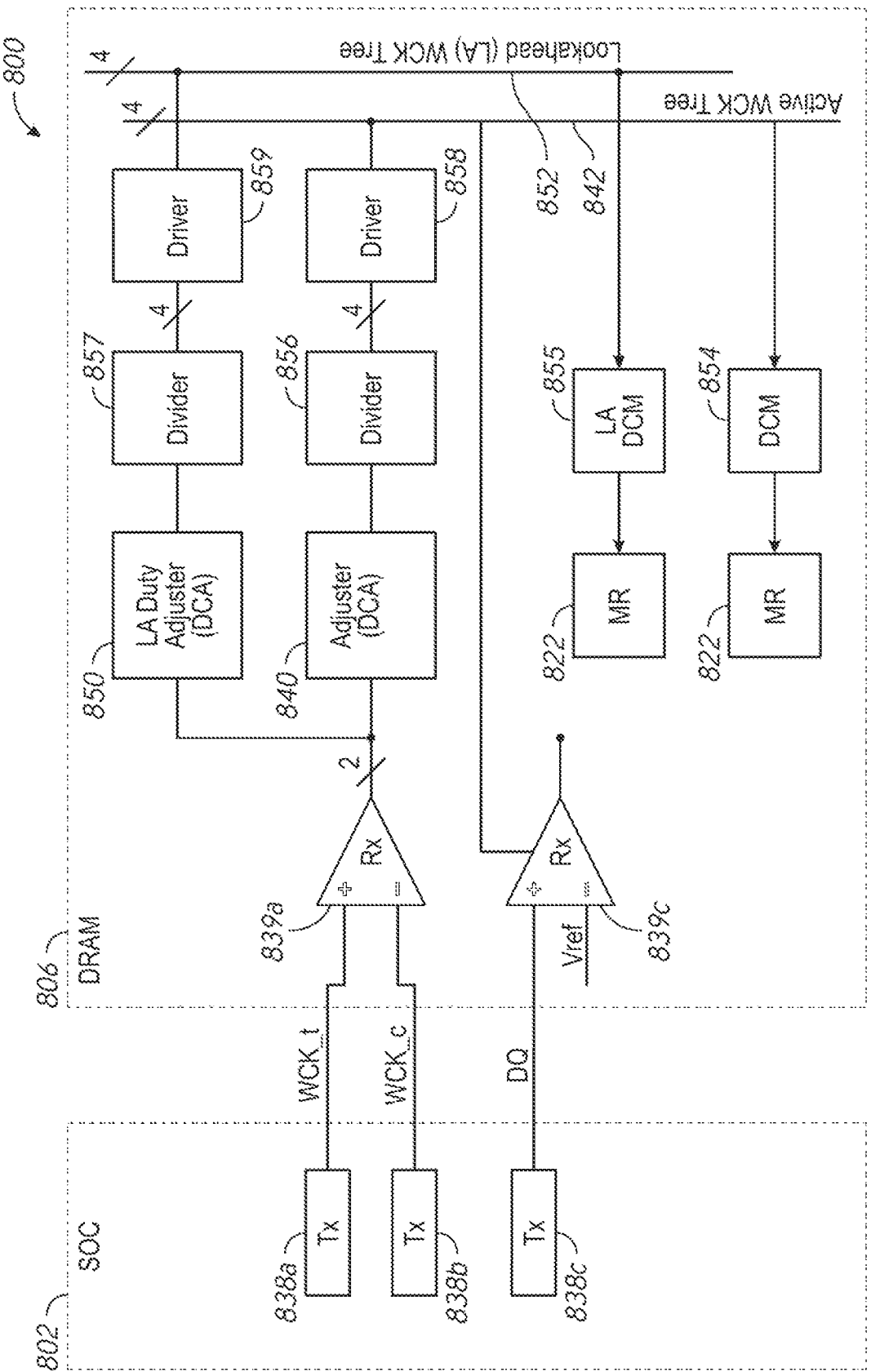
FIG. 8 is a block diagram of a time delay duty cycle adjustment path according to an embodiment of the present disclosure.

FIG. 8 is a block diagram of a time delay duty cycle adjustment path according to an embodiment of the present disclosure. The duty cycle adjustment path 800 may be an implementation of the duty cycle adjustment path 300 of FIG. 3, in some embodiments. The duty cycle adjustment path 800 may have similar components and operation to the duty cycle adjustment path 700 of FIG. 7. For the sake of brevity, repetitive elements will not be described again.

The SoC 802 provides a clock signal to the memory 806 which is received by both the DCA 840 and the lookahead DCA 850. Transmitters 838a,b of the SOC 802 provide the WCK clock to a receiver 839a of the memory 806. Similar to the path 700 of FIG. 7, the SOC 802 may also have a transmitter 838c which provides data DQ to a receiver 839c. The receiver 839c in turn provides internal data that may be provided, for example, to other circuits of the memory 806. Timing of the operation of the receiver 839c may be controlled by the clock provided by the WCK clock tree 842.

Unlike in the duty cycle adjustment path 700 of FIG. 7, in the duty cycle adjustment path 800 the LA DCA 850 is not coupled to the internal WCK clock tree 842. Instead, the LA DCA 850 provides an adjusted clock signal to a lookahead (LA) WCK clock tree 843. The LA WCK clock tree 843 may be a model of the WCK clock tree 842. The LA WCK clock tree 843 may be an implementation of the delay path 352 of FIG. 3 in some embodiments.

The LA DCA 850 may be coupled to the LA WCK clock tree 852 through a divider 857 and driver 859 which are separate from the divider 856 and driver 858 which couple the DCA 840 to the WCK clock tree 842. The dividers 856, 857 and drivers 858, 859 may be physically identical to each other in some embodiments.

The LA WCK clock tree 843 may provide the adjusted clock signal to a lookahead DCM (LA DCM) 855. The LA DCM 855 may be generally similar to the DCM 854. The LA DCA 840, LA WCK clock tree 843, and LA DCM 855 may function in parallel to and generally function as a model of the path with the DCA 840, the WCK clock tree 842, and the DCM 854. Thus, adjustments to the LA DCA 850 may produce a resultant clock signal at the LA DCM 855 which has undergone the same timing changes as the signal between the DCA 840 and the DCM 854. The duty cycle adjustment path 800 may be operated by a controller accessing a mode register 822 in a manner generally similar to the operation of the path 700 of FIG. 7.

Figure 9:
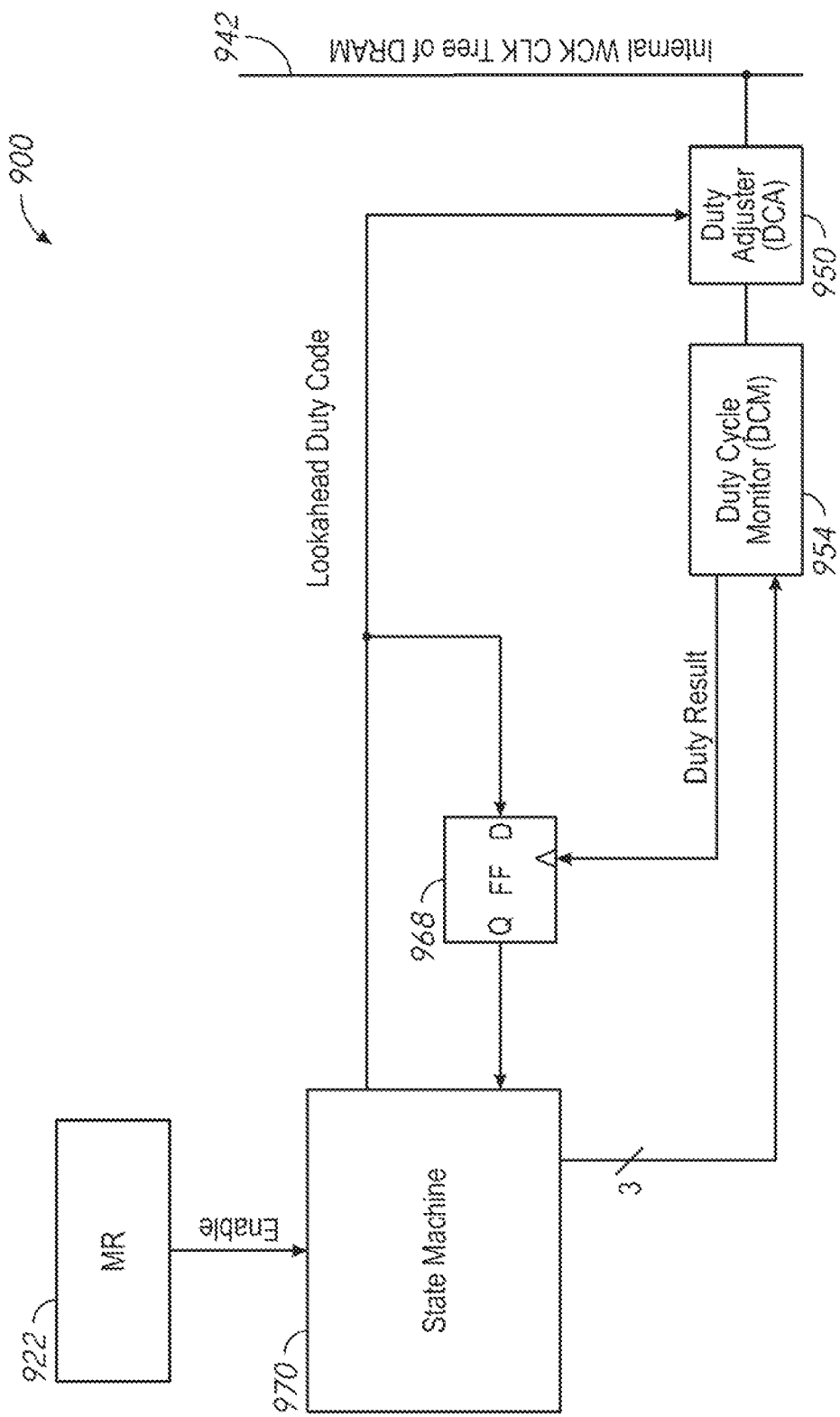
FIG. 9 is a block diagram of a state machine duty cycle adjustment path according to an embodiment of the present disclosure.

FIG. 9 is a block diagram of a state machine duty cycle adjustment path according to an embodiment of the present disclosure. The duty cycle adjustment path 900 may be an implementation of the duty cycle adjustment path 300 of FIG. 3. In particular, the duty cycle adjustment path 900 shows an alternate method of controlling certain aspects of the lookahead operation using a state machine 970 which may be located on the memory (e.g., memory 306 of FIG. 3) rather than relying on a controller. In some embodiments, the state machine 970 may be an implementation of the logic 356 of FIG. 3. Although FIG. 9 shows a specific implementation of the duty cycle adjustment path 900 in a layout similar to the duty cycle adjustment path 700 of FIG. 7, the duty cycle adjustment path 900 could also be implemented in an embodiment with a layout similar to the duty cycle adjustment path 800 of FIG. 8. For the sake of brevity components and operations which are similar to previously described duty cycle adjustment paths will not be repeated again.

The duty cycle adjustment path 900 includes a LA DCA 950, a DCM 954, a latch circuit 968, and a state machine 970. The LA DCA 950 is coupled to an internal WCK clock tree (e.g., WCK clock tree 742 of FIG. 7 or 842 of FIG. 8) and provides an adjusted signal to the DCM 954. The DCM 954 provides a signal 'duty result' to a trigger of the latch circuit 968. The state machine 970 is coupled to the mode register 922 and may retrieve values from registers of the mode register 922 and/or write information to registers of the mode register 922 in manners analogous to MRR and MRW operations respectively. The state machine 970 may be coupled to provide the lookahead duty code to the LA DCA 950 and the latch circuit 968, and one or more control signals to the DCM 940.

The state machine 970 may operate in a manner generally similar to the operation of the controller described with respect to FIG. 7. However, the state machine 970 may be a component of the memory, and may carry out various operations automatically once enabled. The state machine 970 may monitor the value of an enable register of the mode register 922. When enable is activated (e.g., switched to a high logical value), the state machine 970 may carry out a lookahead operation. The value of enable may be changed by a component of the memory (e.g., the state machine 970) or may be changed by an external component such as the controller.

Once activated, the state machine 970 may begin updating the value of the lookahead duty code in the mode register 922 and providing that value to the LA DCA 950 and to an input of the latch circuit 968. The LA DCA 950 may update the clock signal based on the value of the lookahead duty code, and provide the adjusted signal to the DCM 954. The DCM 954 may be controlled by one or more values provided by the state machine 970, which may read them from the mode register 922. For example, the state machine 970 may provide signals such as Polarity and enable (as described with respect to the DCM 754 of FIG. 7) to the DCM 954.

When the output Duty Signal provided by the DCM 954 changes, it may trigger the latch circuit 968 to latch the current value provided to the input of the latch circuit 968. Accordingly, the change in duty result may cause the latch circuit 968 to latch the current value of the lookahead duty code. The state machine 970 may retrieve the value latched on the latch circuit 968. In some embodiments the state machine 970 may retrieve the value from the latch circuit 968 when a sequence of lookahead duty codes has finished. Similar to the operation of the duty cycle adjustment path 700 of FIG. 7, a value may be recorded for each value of Polarity, and an average taken of the two values. This may be a Duty code Adjustment value, which may be saved to a register of the mode register 922. A controller coupled to the memory device may update the active DCA (e.g., DCA 340 of FIG. 3) based on the value of Duty code Adjustment.

In some embodiments, the state machine 970 may provide one or more signals without storing those values in the mode register 922 or reading the values from the mode register 922. For example, the state machine 970 may generate a signal (e.g., the Polarity signal) and provide it to components (e.g., the DCM 956) without there being a register of the mode register 922 which stores that signal. The use of the state machine 970 may reduce the complexity of the mode register 922 and/or controller.

Figure 10:
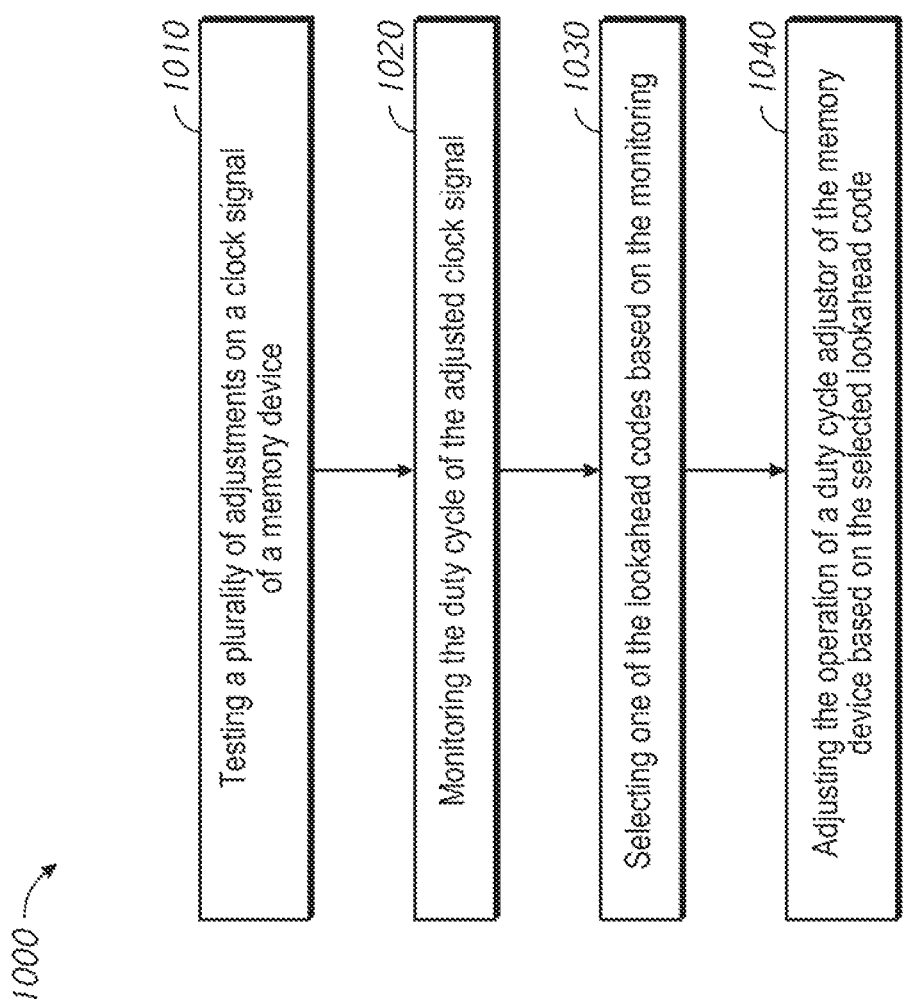
FIG. 10 is a flow chart depicting a lookahead operation according to an embodiment of the present disclosure.

FIG. 10 is a flow chart depicting a method of a lookahead operation according to an embodiment of the present disclosure. The lookahead operation 1000 may be performed by one or more of the devices described in the preceding figures. Steps of the operation 1000 may be repeated, and steps may be carried out in a different order than the one shown in FIG. 10. The lookahead operation 1000 involves block 1010, which describes testing a plurality of adjustments on a clock signal of a memory device. The testing may include adjusting a duty cycle of the clock signal based on each of a plurality of lookahead duty codes. The testing may happen concurrently with access operations (e.g., read and write operations) of the memory device. The lookahead duty codes may be provided by a controller of the memory device (e.g., controller 102 of FIG. 1), or may be provided by a logic circuit on a memory chip of the memory device (e.g., logic 356 of FIG. 3). The duty cycle of the clock signal may be adjusted by a lookahead duty cycle adjustor based on the value of the each of the plurality of lookahead duty codes.

Block 1010 may generally be followed by block 1020, which describes monitoring the duty cycle of the adjusted clock signal. The duty cycle may be monitored by a duty cycle monitor (e.g., DCM 354 of FIG. 3). The monitoring may involve monitoring the clock signal at a first polarity and monitoring the clock signal at a second polarity. The monitoring may be activated by an enable signal. The monitoring may produce a result signal, which may indicate whether the duty cycle of the adjusted clock signal is below 50% or above 50%.

Block 1020 may general be followed by block 1030, which describes selecting one of the lookahead duty codes based on the monitoring. The selected lookahead duty code may correspond to a lookahead duty code that lead to the duty cycle of the adjusted clock signal being approximately 50%. In some embodiments, the selecting may involve determining a first lookahead duty code based on monitoring at a first polarity and a second lookahead duty code based on monitoring at a second polarity. In some embodiments, the clock signal may be continuously generated throughout the testing (e.g., block 1010), the monitoring (e.g., block 1020) and the selecting (e.g., block 1030).

Block 1030 may generally be followed by block 1040, which describes adjusting the operation of a duty cycle adjustor of the memory device based on the selected lookahead duty code. In some embodiments where a first and second lookahead duty code were selected, the duty cycle adjuster may be adjusted based on an average between the first and second lookahead duty code. In some embodiments the DCA may be adjusted by adjusting a duty code coupled to the DCA. The selected lookahead duty code may be added to the duty code.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

The foregoing description of certain embodiments is merely exemplary in nature and is in no way intended to limit the scope of the disclosure or its applications or uses. The detailed description herein of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The detailed description herein is therefore not to be taken in a limiting sense, and the scope of the disclosure is defined only by the appended claims.

Embodiments of the present disclosure may be referenced with respect to certain descriptions of orientation (e.g., an upper surface, a lower portion, vertical alignment, etc.). It should be understood that these are used for descriptive purposes only to describe the relative positioning of certain components to each other, and that embodiments of the present disclosure may have any orientation in space.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. A method of adjusting a data clock signal provided to a memory device, the method comprising:

issuing, from a controller, a first mode register write command to a memory device to cause a first value to be written to a mode register to initiate testing of a plurality of adjustments on a duty cycle of the data clock signal;

issuing, from the controller, a mode register read command to read a result signal stored in the mode register;

issuing from the controller, a second mode register write command to cause a second value to be written to the mode register to select one of a plurality of lookahead duty codes stored in the mode register, based, at least in part, on the result signal; and issuing, from the controller, a third mode register write command to the memory device to terminate the testing.

2. The method of claim 1, comprising:

issuing at least one access command, from the controller, to the memory device to cause the memory device to perform at least one access operation during the testing.

3. The method of claim 2, further comprising:

providing, from the controller, to the memory device data to be written to a memory array, of the memory device; or receiving, from the memory device, at the controller, data read from the memory array of the memory device.

4. The method of claim 1, further comprising, providing, from the controller, a clock signal to the memory device.

5. The method of claim 4, further comprising providing, from the controller, a second clock signal to the memory device, wherein the second clock signal is complementary to the clock signal.

6. A method of adjusting a data clock signal provided to a memory device, the method comprising:

receiving, from a controller, a first mode register write command at a memory device;

writing a first value to a mode register responsive to the first mode register write command;

initiating testing of a plurality of adjustments on a duty cycle of the data clock signal responsive to the first value;

receiving, from the controller, a second mode register write command; and writing a second value to the mode register responsive to the second mode register write command;

selecting one of a plurality of lookahead duty codes stored in the mode register responsive to the second value;

receiving, from the controller, a third mode register write command; and terminating the testing responsive to the third mode register write command.

7. The method of claim 6, further comprising writing a result signal of the testing to the mode register.

8. The method of claim 7, further comprising:

receiving, from the controller, a mode register read; and providing the result signal from the mode register to the controller.

9. The method of claim 6, further comprising adjusting an operation of a duty cycle adjustor of the memory device based on the selected lookahead duty code.

10. The method of claim 6, further comprising providing a first lookahead duty code of the plurality of lookahead duty codes to a first duty cycle adjuster and a second lookahead duty code of the plurality of lookahead duty codes to a second duty cycle adjuster.

11. The method of claim 6, further comprising:

receiving an access command from the controller; and performing the access command concurrently with the testing.

12. The method of claim 6, further comprising:

receiving a clock signal from the controller at the memory device; and generating, with the memory, at least one internal clock signal based, at least in part, on the clock signal, wherein a duty cycle of the internal clock signal is based, at least in part, on the one of the plurality of duty codes.

13. The method of claim 6, wherein at least one of the plurality of adjustments increases a duty cycle of an internal clock signal and at least one of the plurality of adjustments decreases the duty cycle of the internal clock signal.

14. A method of adjusting a clock signal provided to a memory device, the method comprising:

adjusting a duty cycle of a clock signal of a memory device with a duty cycle adjuster based on a plurality of lookahead duty codes stored in a mode register, wherein the adjusting is performed concurrently with access operations of the memory device;

monitoring the duty cycle of the adjusted clock signal;

selecting one of the plurality of lookahead duty codes based on the monitoring; and adjusting an operation of a duty cycle adjustor of the memory device based on the selected lookahead duty code, wherein the selecting comprises selecting a first duty code based on monitoring at a first polarity and selecting a second duty code based on monitoring at a second polarity.

15. The method of claim 14, wherein adjusting the operation of the duty cycle adjustor comprises adjusting the operation of the duty cycle adjustor based on an average of the first duty code and the second duty code.

16. The method of claim 14, wherein the monitoring is performed at the first polarity or the second polarity based, at least in part, on a value stored in a mode register.

* * * * *